(12) United States Patent
Murtuza et al.

(10) Patent No.: US 11,257,803 B2
(45) Date of Patent: Feb. 22, 2022

(54) SYSTEM IN A PACKAGE CONNECTORS

(71) Applicant: OCTAVO SYSTEMS LLC, Sugar Land, TX (US)

(72) Inventors: Masood Murtuza, Sugar Land, TX (US); Erik James Welsh, Bellaire, TX (US); Christopher Lloyd Reinert, Frisco, TX (US); Gene Alan Frantz, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 16/549,841

(22) Filed: Aug. 23, 2019

(65) Prior Publication Data

US 2020/0066702 A1 Feb. 27, 2020

Related U.S. Application Data

(60) Provisional application No. 62/722,857, filed on Aug. 25, 2018, provisional application No. 62/782,210, filed on Dec. 19, 2018.

(51) Int. Cl.
*H01L 25/18* (2006.01)
*H01L 23/538* (2006.01)
(Continued)

(52) U.S. Cl.
CPC ......... *H01L 25/18* (2013.01); *H01L 21/4846* (2013.01); *H01L 21/56* (2013.01);
(Continued)

(58) Field of Classification Search
CPC ........... H01L 2224/48091; H01L 25/18; H01L 23/5386; H01L 23/5385; H01L 23/3128; H01L 25/50; H01L 21/4846; H01L 21/56; H01L 24/48; H01L 2224/48227; H01L 25/16; H01L 23/49811; H01L 2225/1058; H01L 2924/15311; H01L 23/49816; H01L 2924/15331; H01L 2224/32225; H01L 2225/1023; H01L 2224/16235; H01L 25/105; H01L 2224/16227; H01L 2924/1533; H01L 2224/73265; H01L 25/0655; H01L 2225/1041; H01L 23/49827; H01L 2924/18161; H01L 2924/19105; H01L 24/97; H01L 24/16; H01L 2224/97; H01L 2224/85; H01L 2924/00; H01L 2924/00014;
(Continued)

(56) References Cited

U.S. PATENT DOCUMENTS

| | | | | |
|---|---|---|---|---|
| 7,145,226 B2* | 12/2006 | Kumamoto | ......... | H01L 23/3128 257/686 |
| 8,952,516 B2* | 2/2015 | Zohni | ................. | H01L 25/0657 257/686 |

(Continued)

*Primary Examiner* — Alexander O Williams
(74) *Attorney, Agent, or Firm* — Rothwell, Figg, Ernst & Manbeck, P.C.

(57) ABSTRACT

A System in a Package (SiP) device is provided with an interconnect area or a physical space on a main SiP substrate that allows for a customizable second packaged component or device to be externally interconnected with the components on the main substrate of a packaged SiP to allow for modifications to the functionality of the components and devices on a primary (or main) SiP substrate.

18 Claims, 26 Drawing Sheets

(51) Int. Cl.
  *H01L 23/31*   (2006.01)
  *H01L 25/00*   (2006.01)
  *H01L 21/48*   (2006.01)
  *H01L 21/56*   (2006.01)
  *H01L 23/00*   (2006.01)

(52) U.S. Cl.
  CPC ...... *H01L 23/3128* (2013.01); *H01L 23/5385* (2013.01); *H01L 23/5386* (2013.01); *H01L 24/48* (2013.01); *H01L 25/50* (2013.01); *H01L 2224/48227* (2013.01)

(58) Field of Classification Search
  CPC ............. H01L 2224/81; H01L 2224/83; H01L 23/538; H01L 23/31; H01L 23/00; H01L 25/00; H01L 21/48
  USPC ........................................................ 257/668
  See application file for complete search history.

(56) References Cited

U.S. PATENT DOCUMENTS

| | | | |
|---|---|---|---|
| 10,332,854 B2* | 6/2019 | Katkar | H01L 24/32 |
| 10,529,636 B2* | 1/2020 | Katkar | H01L 21/6835 |
| 2008/0224298 A1* | 9/2008 | Corisis | H01L 24/97 257/690 |
| 2010/0032821 A1* | 2/2010 | Pagaila | H01L 25/105 257/686 |
| 2012/0038040 A1* | 2/2012 | Jang | H01L 25/105 257/737 |
| 2012/0104623 A1* | 5/2012 | Pagaila | H01L 25/0657 257/774 |
| 2015/0131231 A1* | 5/2015 | Yoo | H05K 3/4007 361/707 |
| 2017/0365587 A1* | 12/2017 | Hung | H01L 21/565 |
| 2017/0373040 A1* | 12/2017 | Pagani | G01R 31/2884 |
| 2020/0211977 A1* | 7/2020 | Kim | H01L 21/563 |

* cited by examiner

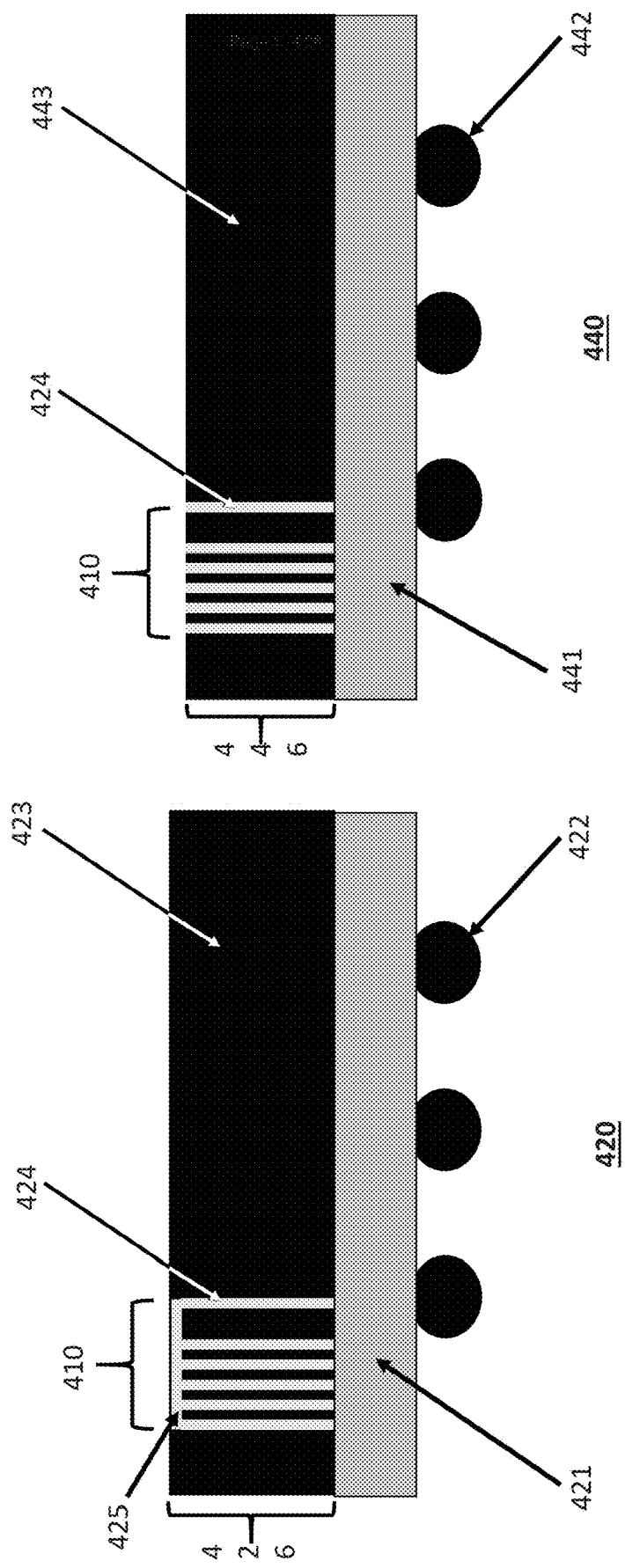

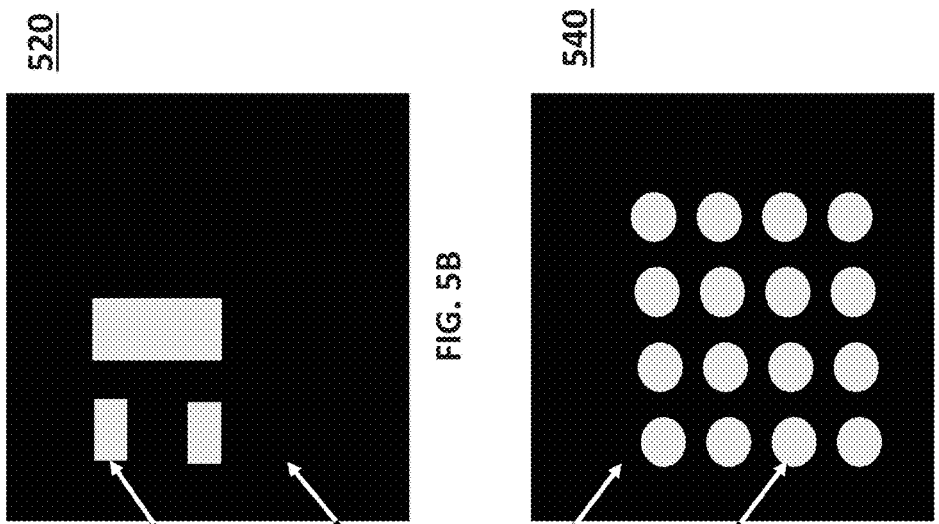
FIG. 5B
FIG. 5C
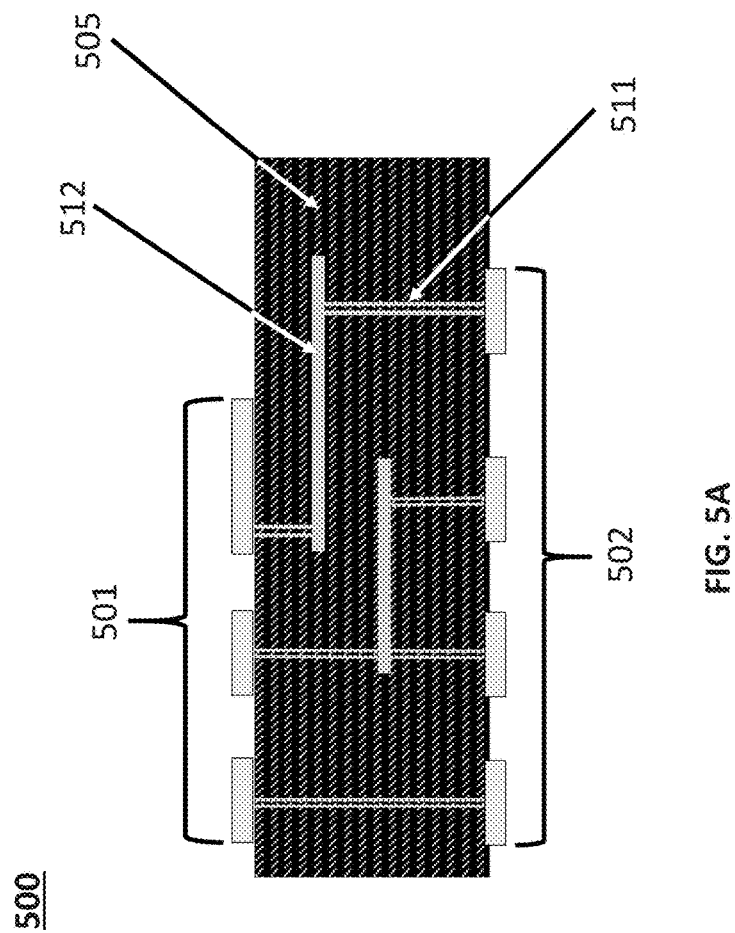
FIG. 5A

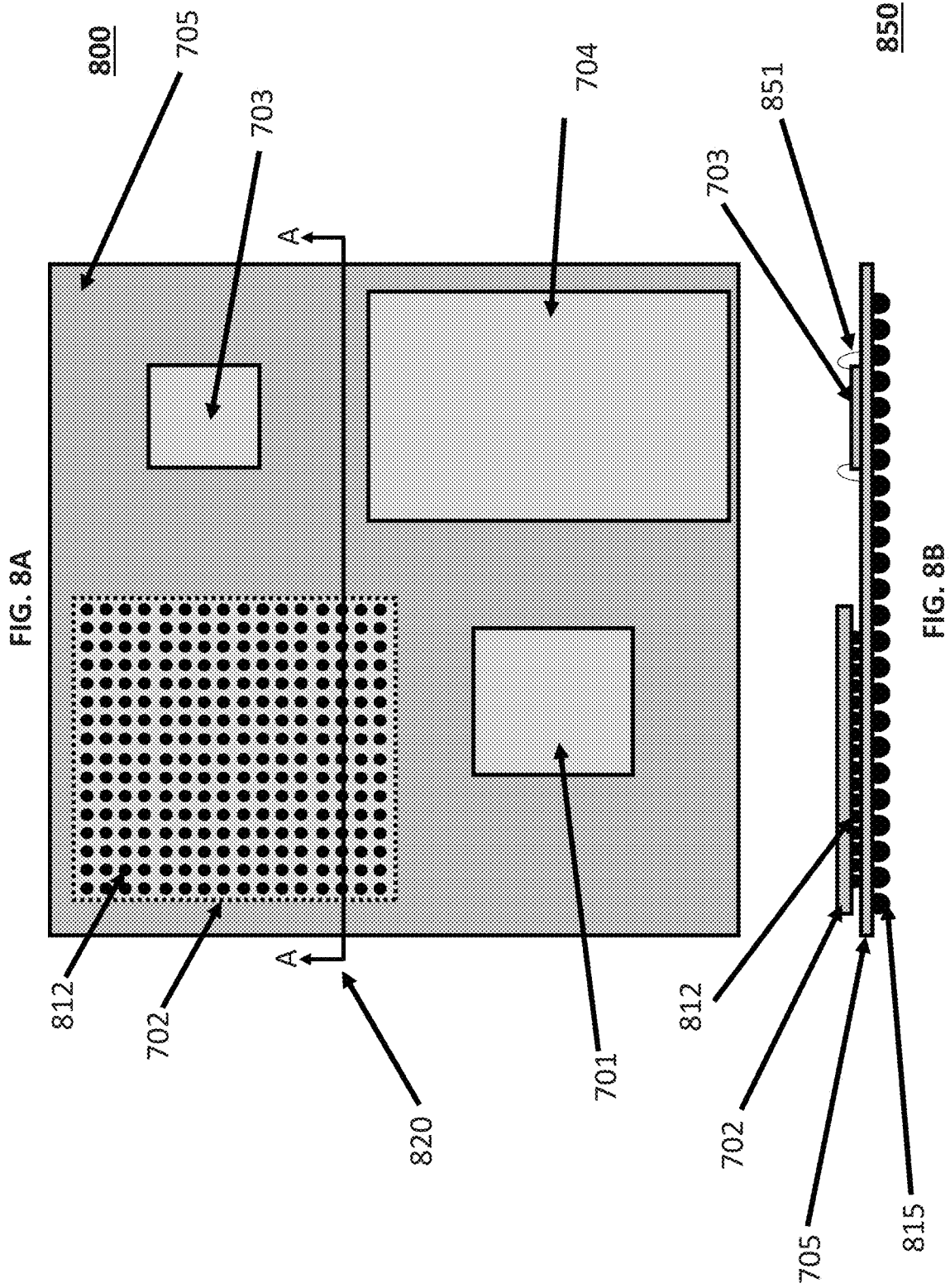

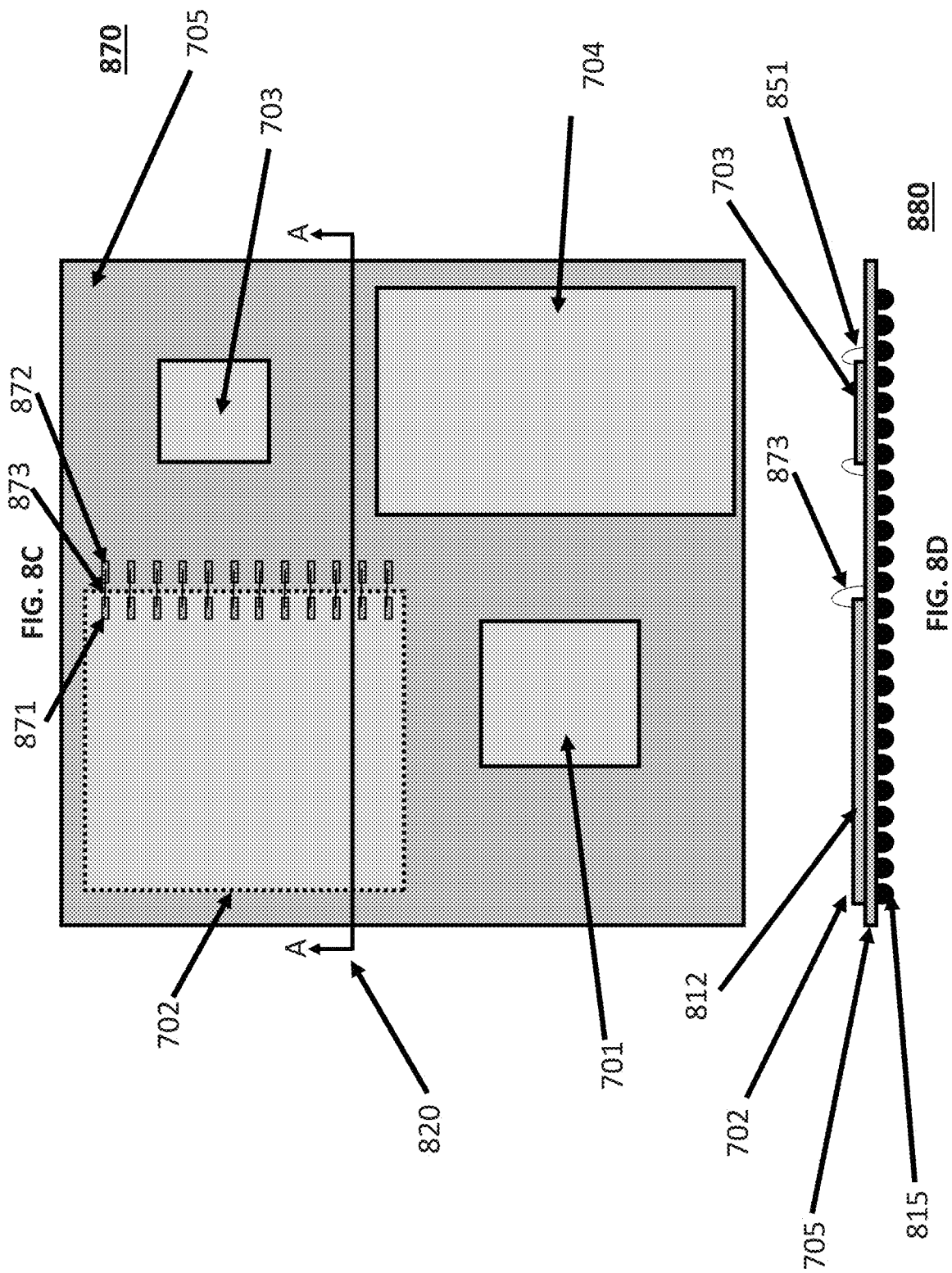

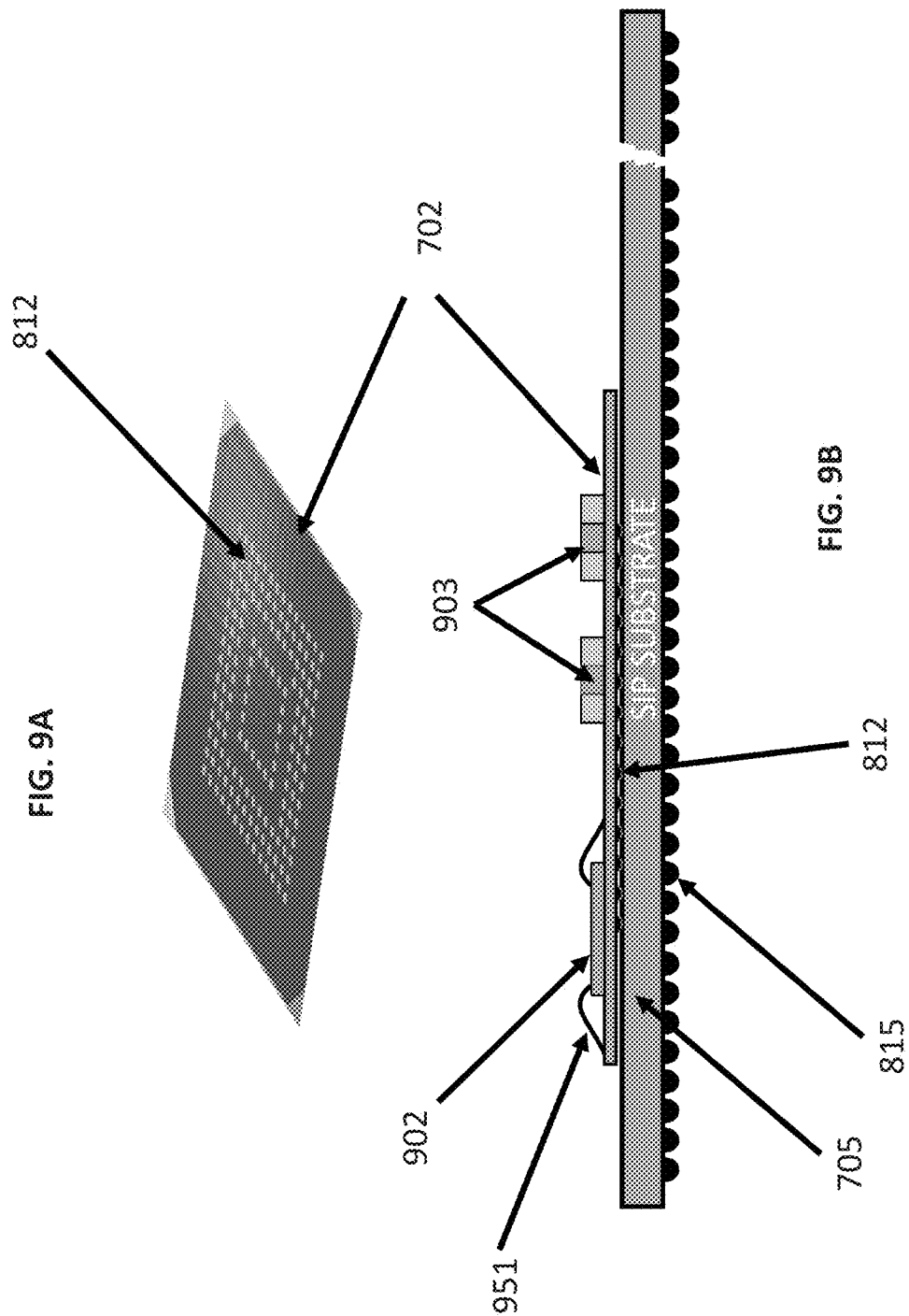

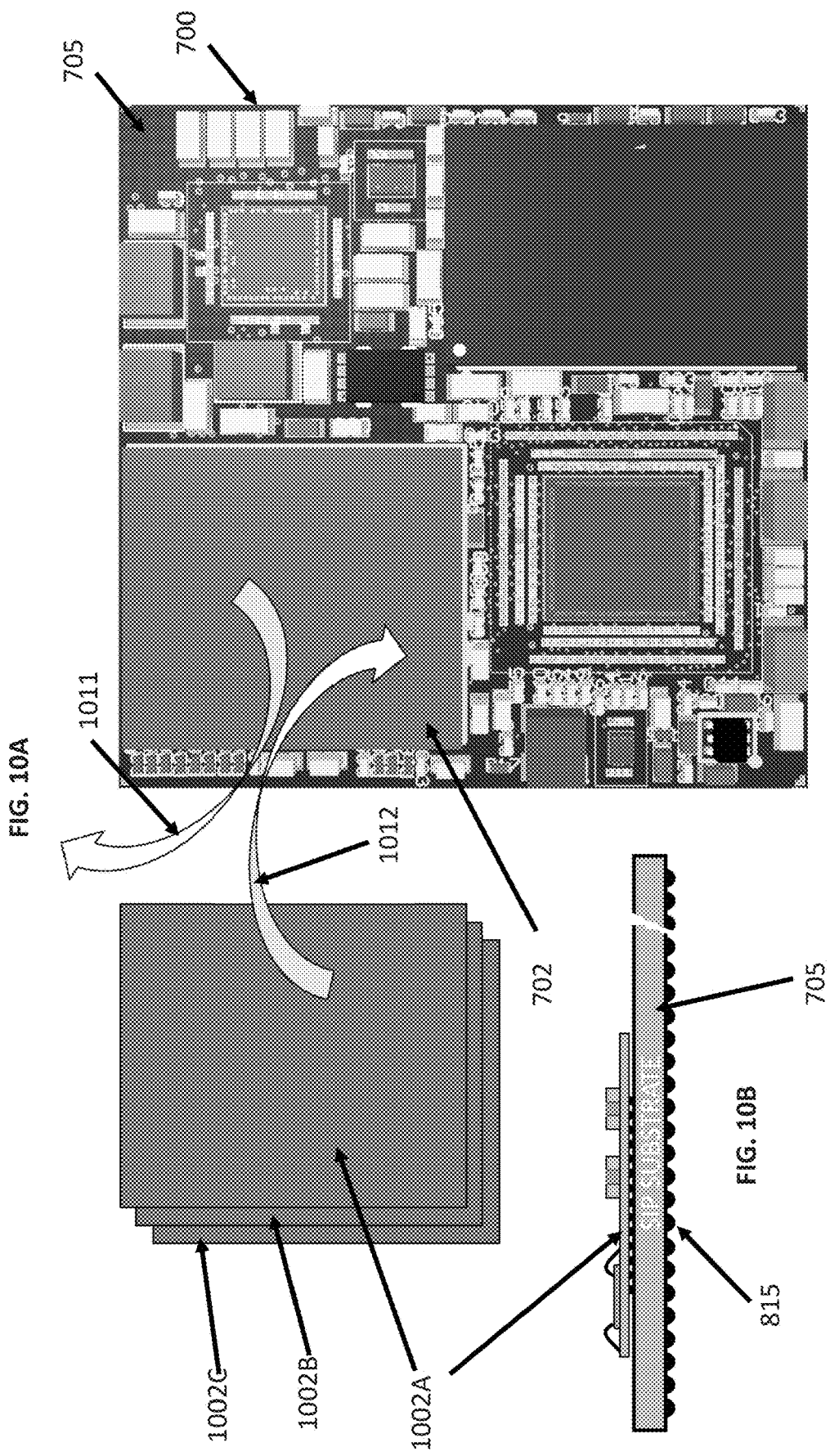

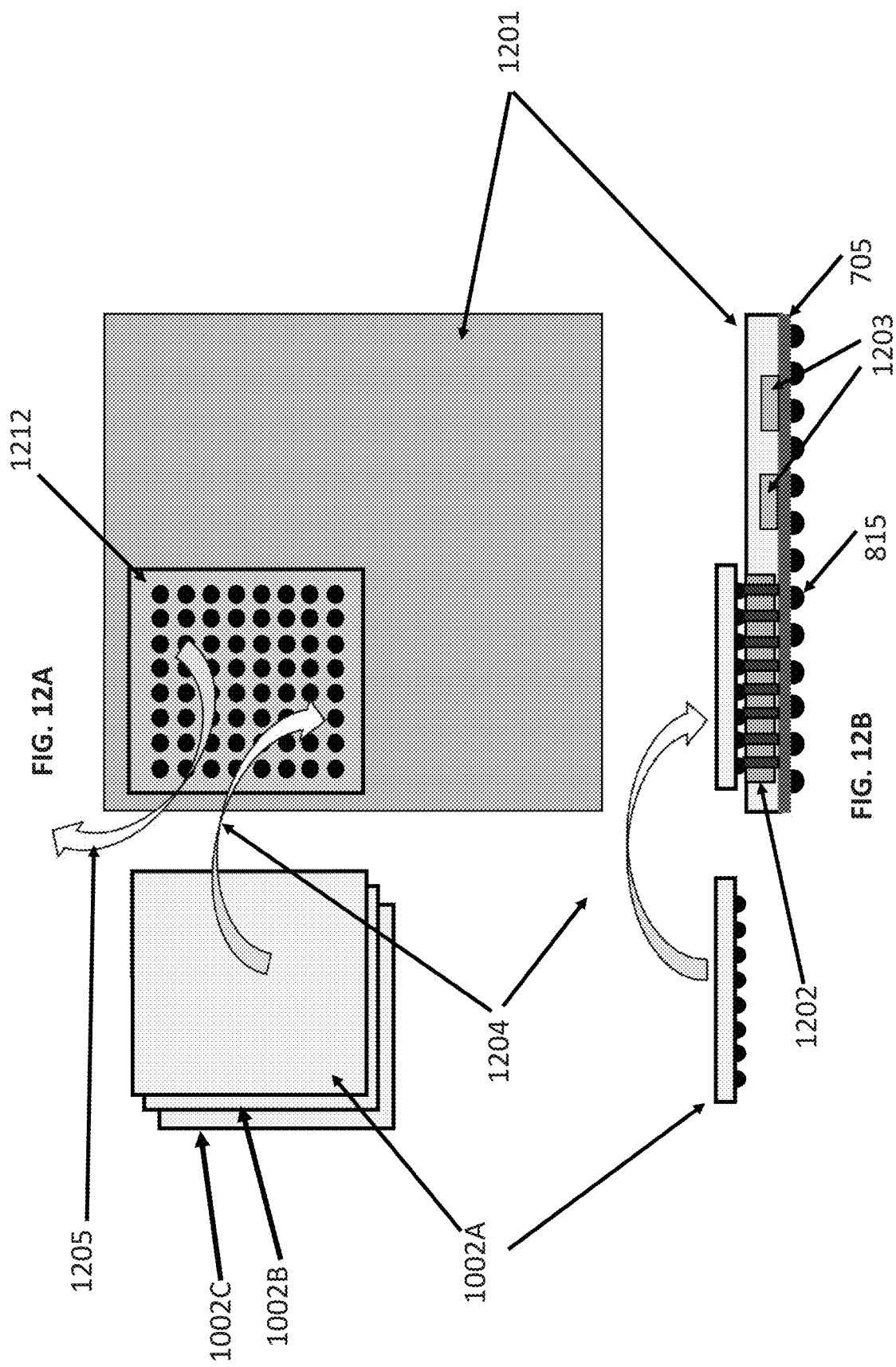

SYSTEM IN A PACKAGE CONNECTORS

CROSS-REFERENCE TO RELATED APPLICATIONS

This application claims priority under 35 U.S.C. § 119 to Provisional Application Ser. No. 62/722,857, filed on Aug. 25, 2018, and Provisional Application Ser. No. 62/782,210, filed on Dec. 19, 2018, which are incorporated herein by reference in their entireties.

TECHNICAL FIELD

Aspects of disclosure relate to structures and methods for modifying the function of a packaged System in a Package (SiP) device.

BACKGROUND

System-on-a-Chip ("SoC") refers to a device currently used in the semiconductor industry that incorporates different functional circuit blocks on a single monolithic block of silicon to form one system circuit. Systems in a Package ("SiP"s) are currently used in the semiconductor industry to assemble multiple integrated circuits, other devices and passive components in one package.

SUMMARY

SiPs enable integration of devices with diverse device fabrication technologies such as digital, analog, memories and other devices and components such as discrete circuits, devices, sensors, power management and other SiPs that are otherwise impossible or impractical to integrate in a single silicon circuit like an ASIC or SoC. These other discrete circuits may include non-silicon based circuits, such as organic, germanium, or Gallium Nitride (GAN). SiPs are also attractive because SiPs allow miniaturization of microelectronic systems from a printed circuit board tens of square cm in size to typically a single package a few square cm or less. A benefit of a SiP is that it allows for building prototypes in order to test a system prior to further integration of some or all of the components into a single monolithic silicon circuit to produce a SoC.

Current SiP solutions combine multiple functional components and devices in a single package. These SiPs may be either entirely customized for a specific function or purpose, or they may be general-purpose building blocks around which specific components may be added for a specific application. There are drawbacks in both types of SiPs—for the case of custom SiPs they are usually single-purpose products and require extensive redesign if there is a change to be made. The case of the general-purpose building block SiPs are good because of the potential use in many applications with additional specific components added for each application. However, the disadvantage of the general purpose SiP is that it grows the component count and some of the space and costs savings of using a single purpose or custom SIP are lost.

Aspects of the present disclosure allow for simplification of system design by using an interposer (e.g., a second substrate in a SiP). In some embodiments a SiP substrate may be used as the interposer on another SiP substrate. An interposer may be used to further miniaturize a SiP by mounting and electrically interconnecting components on that interposer to form a module, where the module maybe attached to the substrate of a SiP as another internal component. By mounting various internal and external modules with different functions on to the same SiP substrate, different SiP systems may be created.

According to embodiments, a SiP is provided that is customizable without certain disadvantages of a custom SiP or a standard building block SiP. One aspect of the present disclosure is to provide an internal interconnect area or physical space on the primary (or main) SiP substrate that allows for a customizable second packaged component or device to be externally interconnected with the components on the primary (or main) substrate of a packaged SiP to allow for modifications to the functionality of the components and devices on a primary (or main) SiP substrate. In some embodiments, this internal interconnect area may have a fixed number of input/output (I/O) and power supply connectors or ports that connect to a pre-determined fixed pattern of connectors on an exterior surface of the SiP package. This exterior area of connectors may then be populated with a plurality of different secondary packaged components or devices. These secondary packaged components or devices may have a pattern of external electronic connectors on their bottom side to match the pre-determined pattern of electrical connectors on the primary SiP's top exterior surface. The top side of any such secondary packaged components or devices may also be designed in a pattern or physical arrangement to accept the external connectors of other different components and functional blocks. This will allow the top side to be customized depending on the additional functionality or capabilities a particular application requires. Some of these functions or capabilities may include, for example and not limited to, WIFI, video, accelerometer, temperature, pressure sensors, security function, or even a general purpose bread-board.

The methods of the present disclosure allow customization of a packaged SiP without paying the penalty of additional price and engineering overhead associated with custom SiPs. These secondary packaged components or devices may be designed by a user and opens up the general purpose type of SiP design to limitless customization possibilities.

These and other features of the disclosure will become apparent to those skilled in the art from the following detailed description of the disclosure, taken together with the accompanying drawings.

BRIEF DESCRIPTION OF THE DRAWINGS

FIGS. 4A, 4B and 4C depict side views of a riser structure according to some embodiments.

FIGS. 5A, 5B and 5C depict a side view and top views, respectively, of embodiments using a riser structure.

FIGS. 8A, 8B, 8C and 8D depict a side views and top views of a SiP device according to some embodiments.

FIGS. 9A and 9B depict a mezzanine device and its attachment to a SiP substrate, respectively, according to an embodiment.

FIG. 10A depicts the replacement of one mezzanine device with either a second or third mezzanine device on a SiP according to an embodiment.

FIG. 10B depicts a cross section of a SiP with an attached mezzanine device/component according to an embodiment.

FIGS. 12A and 12B depict a top view and a side view of the replacement of one mezzanine device with a second or third mezzanine device on a packaged SiP device, respectively, according to an embodiment.

DETAILED DESCRIPTION

As used herein, the term "module" or "mezzanine device" is used to refer to one of a family of interchangeable substrates populated with components for use in altering the function of a SiP device when electrically connected to a set of exterior connectors associated with a packaged SiP's base substrate. By way of example, a base SiP device may be altered to change its functionality dependent on which packaged or unpackaged module from a family of modules is externally connected to a SiP's primary or base substrate. In the context of the current disclosure, an "interposer" may be used to mean another substrate in a SiP. In the context of the current disclosure, the term "riser" may be used to mean a conductive path, or paths making operative connections with a portion of an interior substrate of a SiP to conductors located on an exterior surface of the SiP package (e.g., top surface). The interior substrate may be the base substrate for the SiP or an interposer inside the SiP. In some embodiments, a riser comprises a plurality of vias arranged in a pattern. In some embodiments, the riser comprises a portion of a "thick" (or "tall") multi-layered substrate with appropriate internal connections between conductors arranged in a pattern on a top surface of the substrate and a plurality of conductors arranged in a pattern on a bottom surface of the substrate for connecting to and mounting on a substrate in a SiP. The substrate on which the riser is mounted may be the base substrate for the SiP or an interposer inside the SiP.

Figure 1:
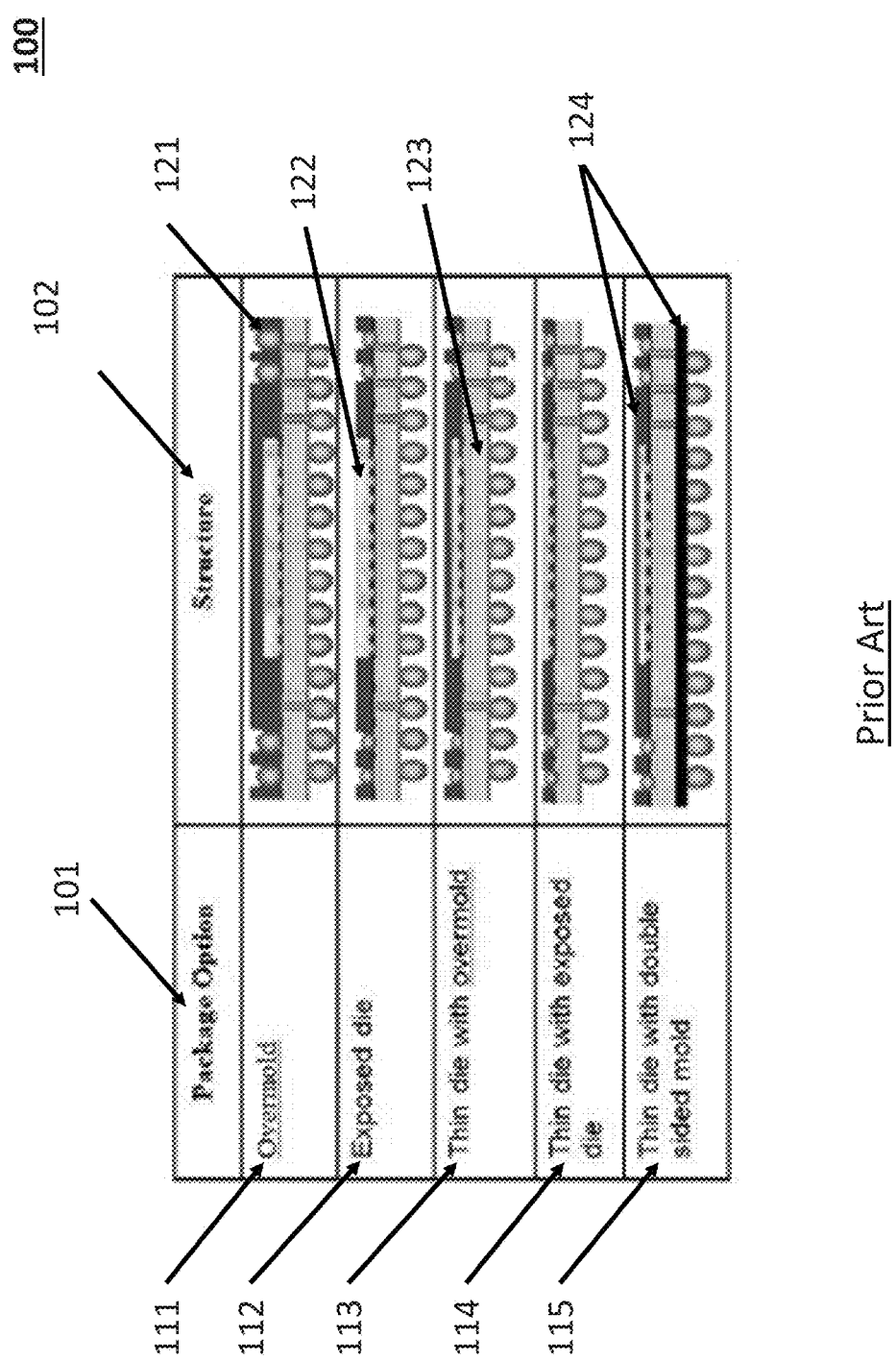
FIG. 1 depicts examples of prior art packaged die used in package on package applications.

FIG. 1 depicts several side views of prior art examples for package on package (PoP) using what is conventionally called "Through Mold Via" (TMV) concepts. These prior art examples use solder balls placed on the substrate of the device package, but before the device is encapsulated with a mold compound, or "packaged". For each example the package option column 101 is listed with a side view image in the structure column 102. Several aspects of the structures are pointed out: the balls 121, the attached die 122, the substrate 123 and the mold compound 124 are the same for each view but are only individually labelled for a portion of each of the views. The general concept of PoP is to attach additional devices on the surface of another device. In each case solder balls 121 are attached to the top surface of the substrate 123 similar to those attached to the bottom surface. Once attached on the top surface of the device substrate, the package is molded with encapsulant. The balls are then suitably exposed by laser ablation or other similar removal techniques for removing the mold compound covering the balls, such that the device to be attached can be electrically and mechanically attached to the now exposed balls 121. The specific options shown in the chart are a package with overmold 111, a package with the die also exposed on the surface 112, a thin die with overmold 113, a thin die with exposed die 114, and a thin die with double sided mold 115 (mold compound on both sides of the substrate 124).

Figure 2:
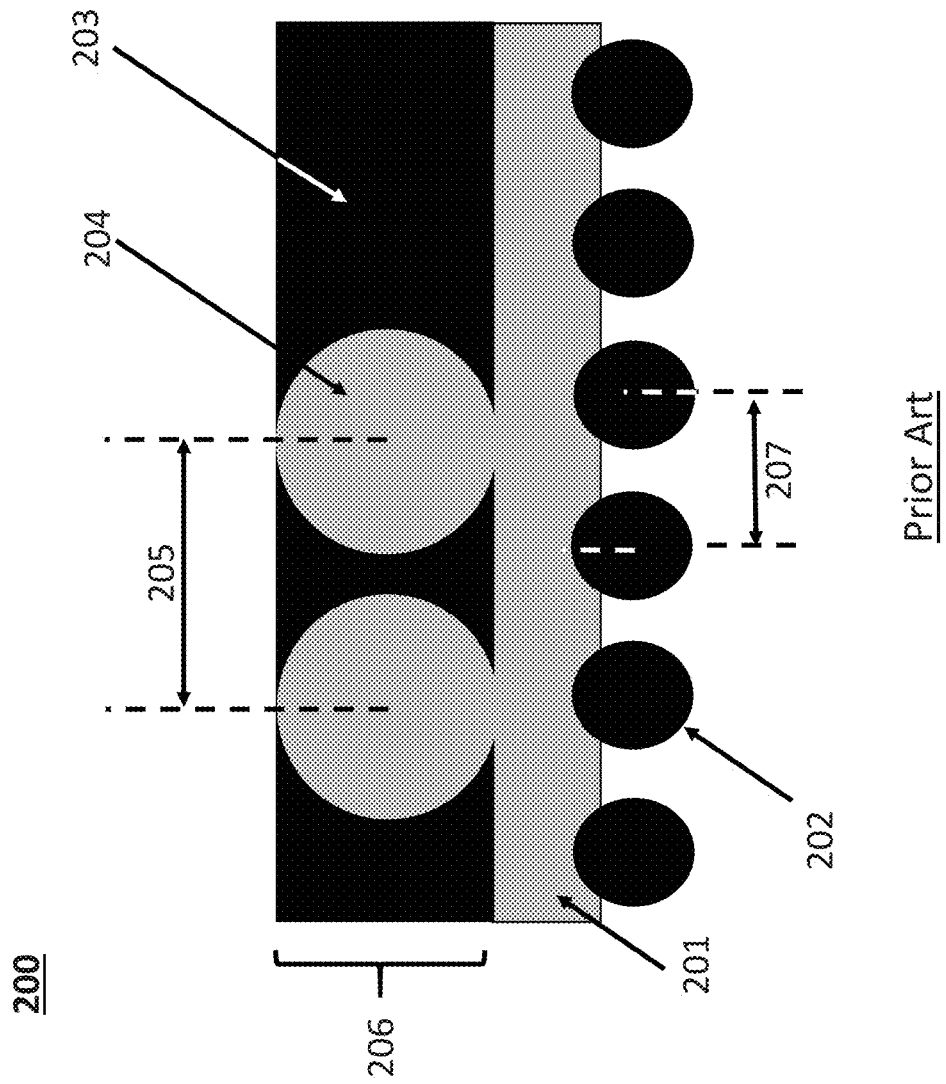
FIG. 2 depicts a prior art example of package on package balls and spacing.

FIG. 2 depicts a portion of a side view of a prior art packaged device 200 using solder balls 204 (also referred to as TMV devices) as depicted in the examples of FIG. 1. This prior art method is normally used in package-on-package (POP), but has limitations on the size and pitch 205 of the balls 204. The connection balls, both on the bottom surface 202 and top surface 204 of the substrate 201 determine the ball to ball pitch 205 and 207 (or ball to ball "spacing"). Due to the thickness of the mold compound 206 needed to protect the die of the device, the ball pitch 205 (or spacing) for the balls 204 on the upper surface can be too large for a component to be placed on the top surface that requires a smaller ball spacing. FIG. 2 illustrates that because a larger size (or diameter) of each ball 204 is needed to be of sufficient diameter to reach the exterior surface (or very near to the surface) of the package of a device that the ball pitch 205 for the upper balls 204 is primarily determined by the thickness of the mold compound 206. This results in increased ball spacing 205 because of the increased ball 204 size. That is, the use of solder balls as vias for a package-on-package limits the pitch and shape of the top pad; a finer pitch, like that of balls 202, requires a thinner mold which is not always possible.

A distinctive feature of one or more embodiments of the riser described herein, which is unique from methods with TMV devices, is that the pitch of external contacts on a surface of the SiP package may be of any pattern, size and spacing, and is not dependent on mold thickness of a package. This flexibility in ball pitch and position is due to the design of the riser connectors. The riser connectors may be tall enough to reach the top surface without the need for it to be the same diameter (or thickness) as it is tall. As will be described in further detail below, according to some embodiments, the absence of a fixed diameter ball can allow for smaller ball spacing. That is, a riser with internal vias behaves more like a package pin rather than a package ball. The riser is not limited to this concept of a pin shape, however, as will be described in further detail below. Another feature of a riser with internal vias is that there may be interconnections, and re-routings within the riser thereby relieving the primary substrate of a SiP of any potential routing congestion.

Figure 3A:
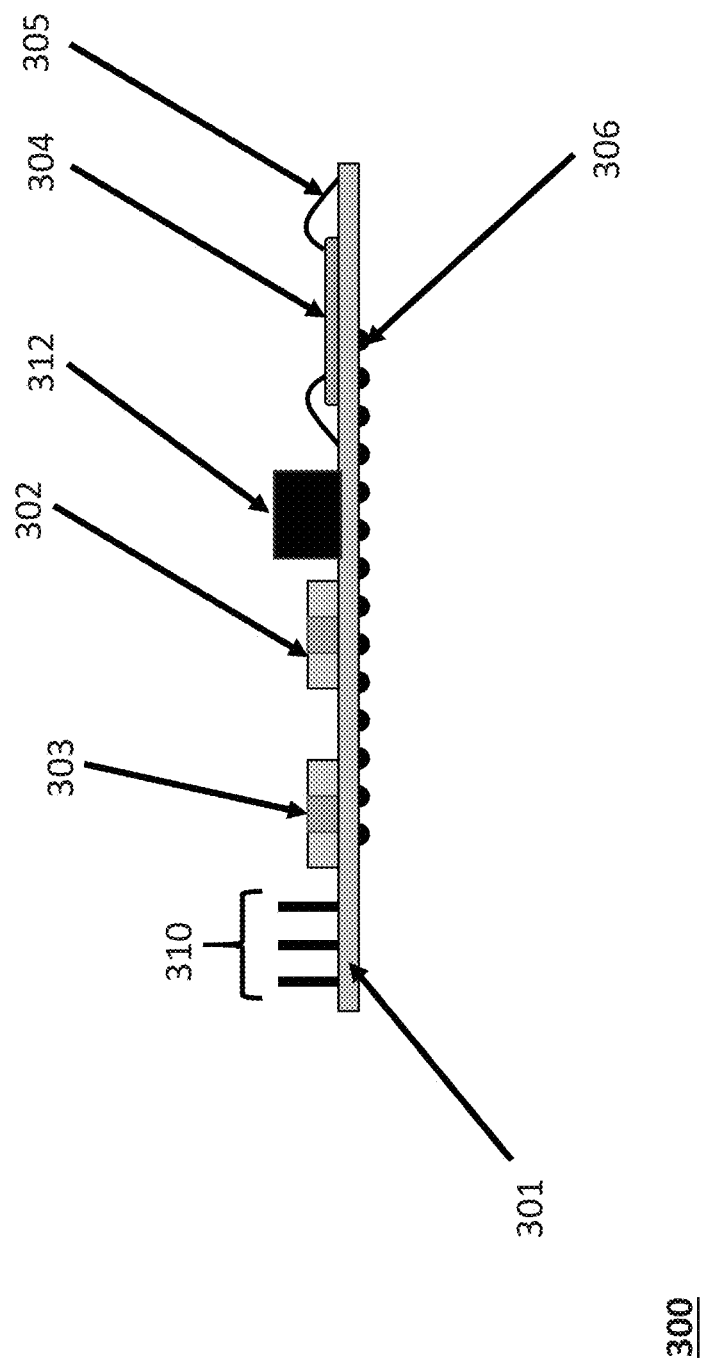
FIGS. 3A, 3B and 3C depict two side views and a top view of an embodiment of a SiP device with various components attached.
Figure 3B:
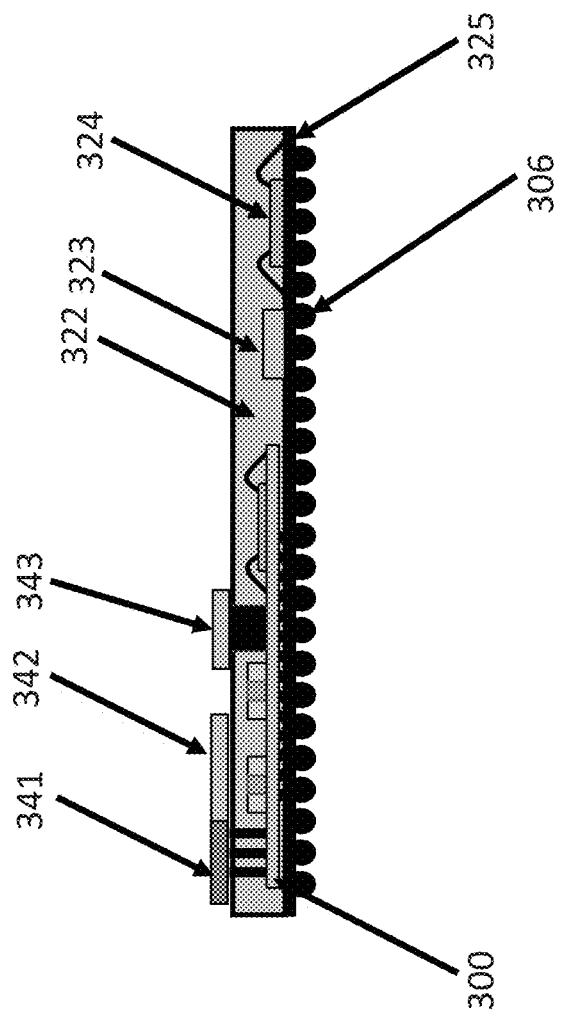
Figure 3C:
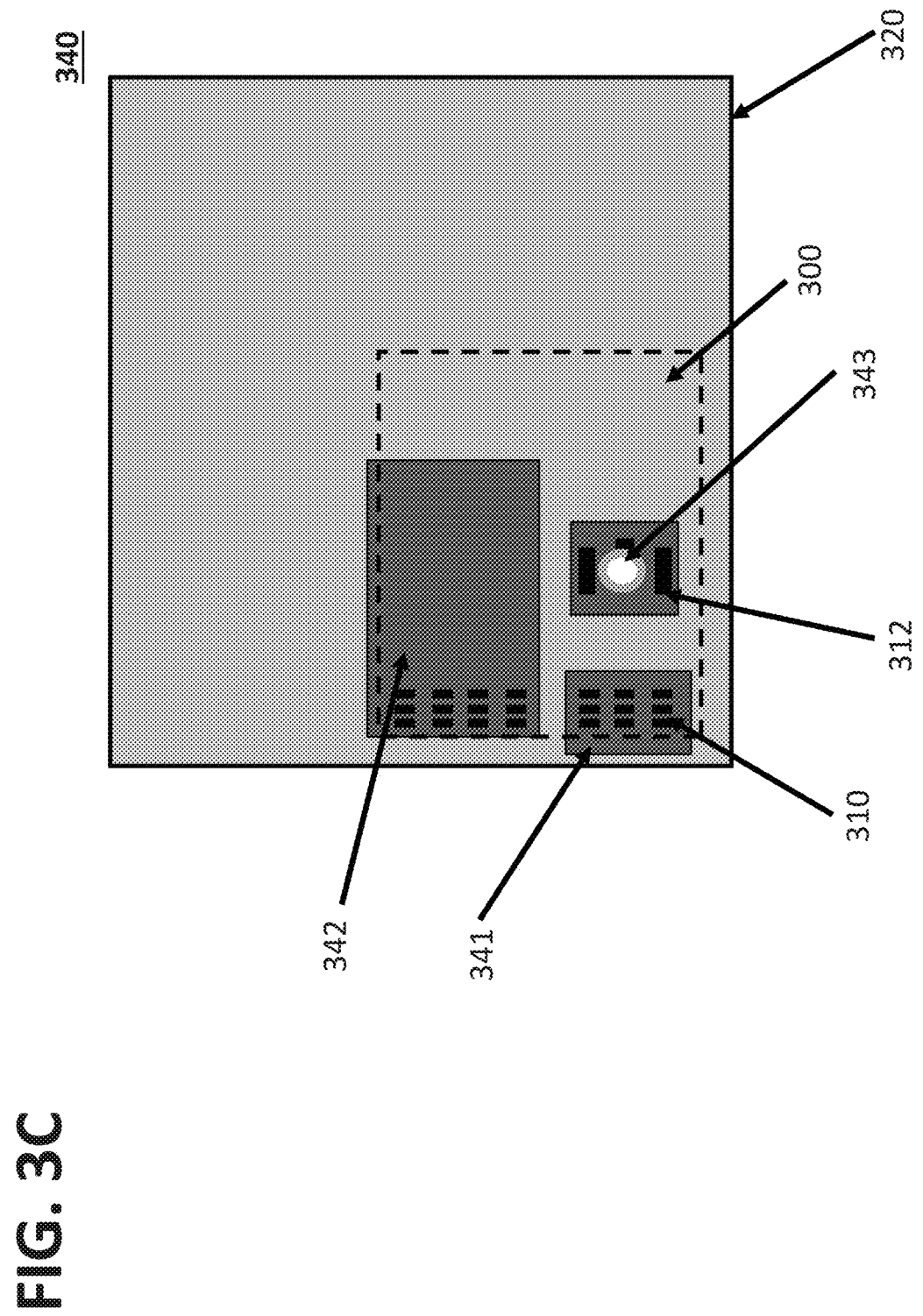

FIGS. 3A, 3B and 3C depict two side views and a top view, respectively, of a set of connectors for a SiP package according to some embodiments. Referring now to FIG. 3A, a mezzanine device 300 (or alternatively a SiP base substrate 301) comprises a substrate 301 with attached packaged components 302, 303, an integrated circuit in die form 304 bonded to the substrate using bond wires 305 and a riser 310 comprising an array of conductive pillars for external connections. In some embodiments, the riser 310 may comprise a substrate with dimensions 312 configured such that a mezzanine device may be connected to the top surface of the SiP (as shown in FIG. 3B as 320). The device 300 may comprise a ball grid array 306 attached to a surface of the substrate 301 for connecting the device 300 to a SiP 320.

FIG. 3B depicts a cross sectional view of a SiP device 320 including a mezzanine device 300 attached to a SiP base substrate 325. Although not depicted in FIG. 3A, 3B or 3C, more than one mezzanine device may be attached to the SiP base substrate 325, and multiple risers may be attached to the mezzanine device and/or the SiP base substrate 325. In some embodiments, other components 323,324 may be attached to the substrate 325. After all of the components are attached to a surface of the substrate 325, the components are encapsulated with an encapsulant 322 to form a packaged SiP 320. Finally, the SiP 320 has attached to another surface of the substrate 325 a ball grid array 306 for external connections to other component or systems. The risers 310 are used as external connectors for the SiP 320 and included on a top surface of the SiP 320 when external components 341, 342, 343 are mounted on and connected to the riser connector elements. For example, the external components 341, 342, 343 may be, as non-limiting examples, memory devices, imagers, microphones, RF or Coaxial connectors, and/or sensors.

FIG. 3C depicts the top view of a SiP device 340 like the device 320 of FIG. 3B. Three external devices 341, 342, 343 are depicted as being electrically connected to the SiP 320 through the risers 310, 312 to the mezzanine device 300. The mezzanine device 300 is depicted in the form of a dashed line outline showing its location inside the packaged SiP 320. The physical arrangement or configuration of the connectors 310 created by the risers 310, 312 allow for specific devices with special ball pattern or connection requirements to be connected, or may be arranged in a generic pattern (like a ball grid array) such that additional SiPs and other packaged and unpackaged components or devices may be attached.

Figure 4A:
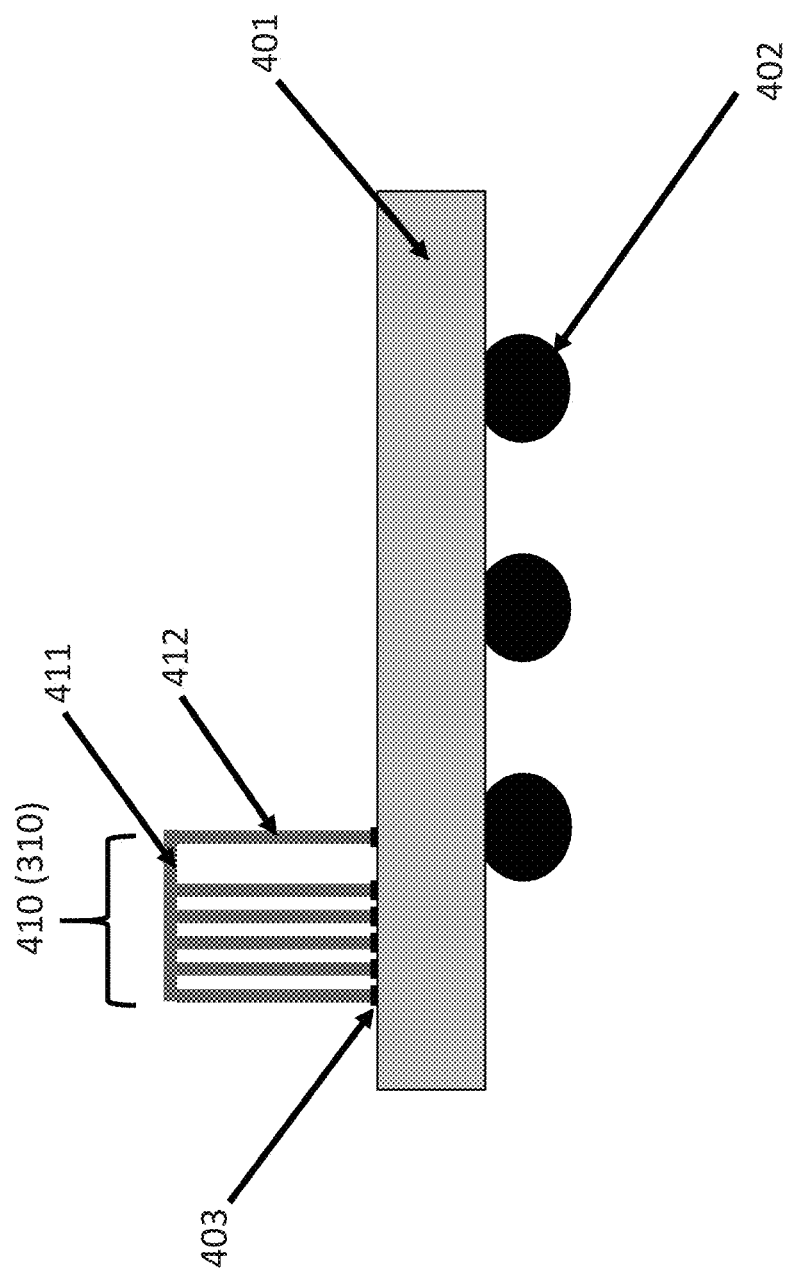

FIGS. 4A, 4B and 4C depict an embodiment of the structure of a riser 410 (referred to as 310 in FIGS. 3A-3C) using a metallic scaffolding 411 comprising columns acting as vias 412 in the riser 410. FIG. 4A depicts the vias 412 and the scaffolding 411 attached to conductors 403 on a base substrate 401, e.g., the SiP base substrate or an interposer substrate, before packaging, e.g., before encapsulation (molding) as shown in FIG. 4A, and after packaging, e.g., after encapsulation (molding) as shown in FIGS. 4B and 4C. A potential problem with using a riser 410 comprising multiple individual columns as vias 412 may be the need to hold the columns together prior to molding the riser in a package. If the vias 412 are connected, the vias would be shorted together, but if the vias are not connected together then the vias may not keep their relative positions and desired physical arrangement during molding. In one embodiment, the metal columns that form the vias 412 are held together during any molding process with a holding plate or holding bar (hereinafter referred to as the holding portion 411) on a top surface each of the vias 412. In this embodiment, the vias 412 and the holding portion 411 form a single rigid riser structure during a molding or packaging process.

After molding, the portion of the riser 410 that holds the vias 412 in their correct desired position, e.g., the holding portion 411, on the SiP exterior package surface during molding is then removed by grinding (or any other appropriate removal process or technique), thereby isolating and exposing each of the vias 412 in their respective desired physical arrangement to create the desired pattern of connectors or physical layout on the surface of the SiP package. If the riser 410 is attached to an interposer, then connectors, such as balls 402 or bonds wires (not shown) can be used to attach the interposer assembly to the SiP base substrate. If the riser is attached to the SiP base substrate, then the balls 402 may be used as external connectors. Other external connection methods may be used such as, for example, but not limited to, leaded connections, or leadless connections typically found on many packaged devices.

FIG. 4B depicts a small representative portion of an interposer 420 of one embodiment of a SiP 320 (see FIG. 3B) after it has been encapsulated with mold compound 423. As shown in FIG. 4B, the riser 410 comprises the holding portion 425 attached to the individual via 424. The encapsulant (mold compound) may have a thickness denoted by 426.

FIG. 4C depicts the SiP 320 (see FIG. 3B) and the riser 410 as depicted in FIG. 4B after a portion of the encapsulant (mold compound) 443 has been removed. As non-limiting examples, the portion of the encapsulant 443 including the holding portion 425 of the riser 410 is removed by shaving or grinding (or any other appropriate removal process). As shown in FIG. 4C, the portion of the encapsulant 443 including the holding portion 410 connected to all of the vias 424 is removed such that the exposed portion of each of the vias 424 comprise an array of one or more connection pads on the top surface of the SiP package 440. Although depicted as being on a SiP base substrate in FIGS. 4A-4C, the riser 410 may be attached to any substrate in the SiP package. As a result of the shaving or grinding process, the thickness of the encapsulant 423 (mold compound) is reduced to a thickness 446. While not shown in FIGS. 4A-4C, one or more interposers may be attached to the SiP base substrate in some instances. In such instances, once the SiP substrate is completely populated with the one or more interposers along with the other active and passive devices, it is encapsulated with mold compound, thereby encapsulating or packaging the SiP, before a top surface is shaved in order to expose the contact pads, e.g. the exposed top surface of the vias, on the top surface of the SiP 440.

In some embodiments, the riser may have a thickness or height of the SiP mold thickness for the SiP and may comprise any pattern of metal pads. The riser may be mounted between the primary SiP substrate and the molded surface of the SiP. In some embodiments, the riser may be a pre-fabricated metal scaffolding (as depicted in FIG. 4C) or any similar technique to accomplish the function of providing conductive vias from a substrate of a SiP to an exterior surface of a packaged SiP without the limitations of the Through-Mold-Via and similar methods. The riser as described herein may be used in prevalent package on package and any other attachments on a package surface such as connectors, sensors, etc.

FIGS. 5A, 5B and 5C depict one embodiment of a riser 500 in a cross sectional view and two top views, respectively. FIG. 5A depicts a cross sectional view of a substrate 505 with a representative bottom set of external connectors 502 on a bottom surface of the substrate 505 and a representative top set of external connectors 501 on a top surface of a riser using a substrate 505 (also referred to as the "substrate like structure" 505). The connectors 501 and 502 of the two external surfaces of the substrate 505 are interconnected using traces 512 on various layers of the substrate like structure 505 and vias 511 interconnecting the traces 512 on the various layers of the substrate 505. In some embodiments, the use of the vias 424 described in FIG. 4C may be included as part of the riser 500 described in FIG. 5.

FIGS. 5B and 5C depict two different views of connectors for the riser 500. In FIG. 5B a three pin arrangement of one example of a top set of external connectors 501 on the top surface of the SiP 505 is shown for use with special connector requirement devices, such as, but not limited to, a power connector, a RF interface connector, a sensor or a discrete component, either active or passive.

FIG. 5C depicts a ball grid array (BGA) arrangement of one example of a bottom set of external connectors 502 on the bottom surface of the SiP package 505. By using the riser structure 500 the arrangement of the connections on the bottom surface can be mapped to be an alternative arrangement of connections 501 on the top surface of the substrate 505.

Figure 6A:
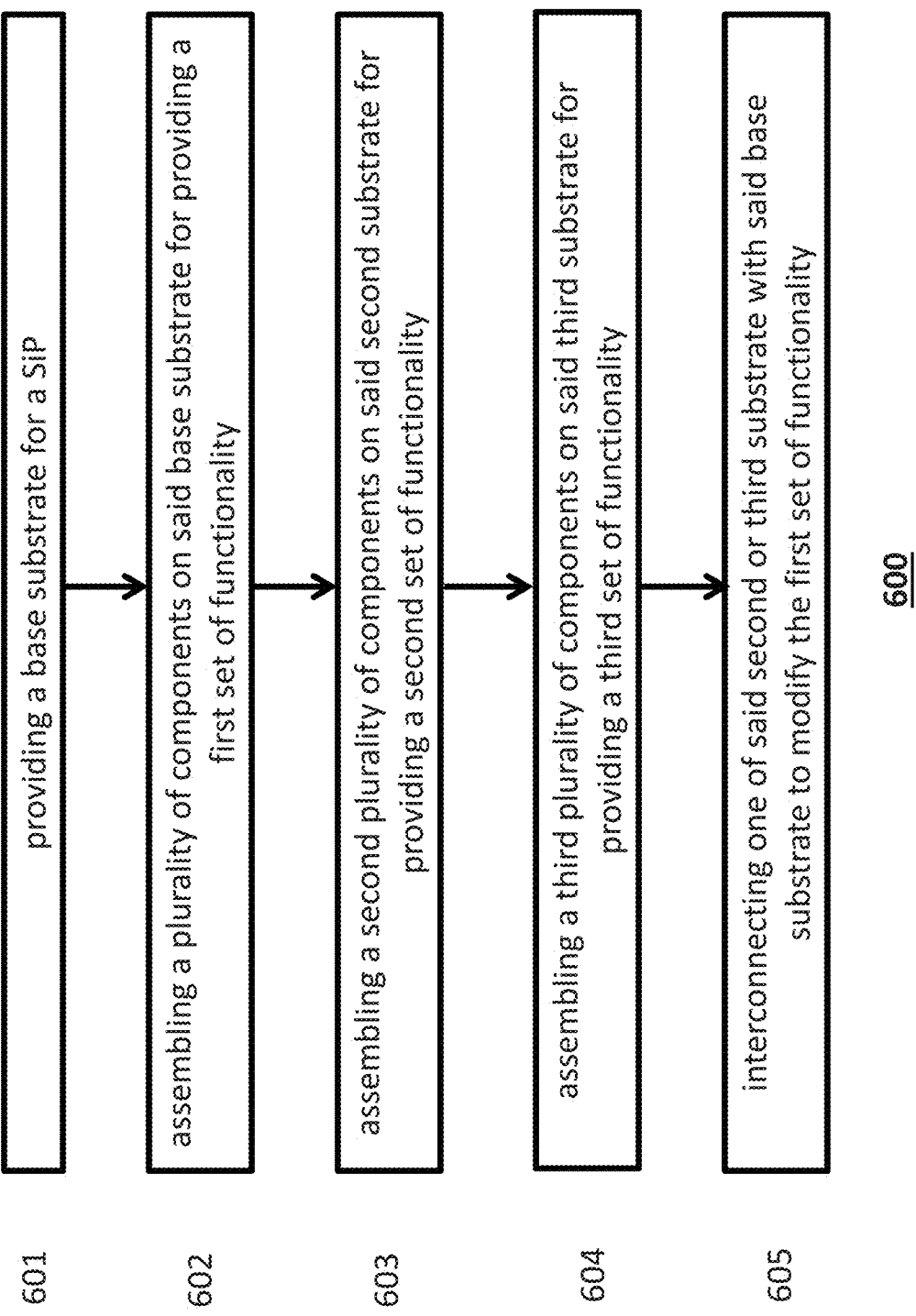
FIGS. 6A, 6B and 6C are flowcharts illustrating a process according to some embodiments.
Figure 6B:
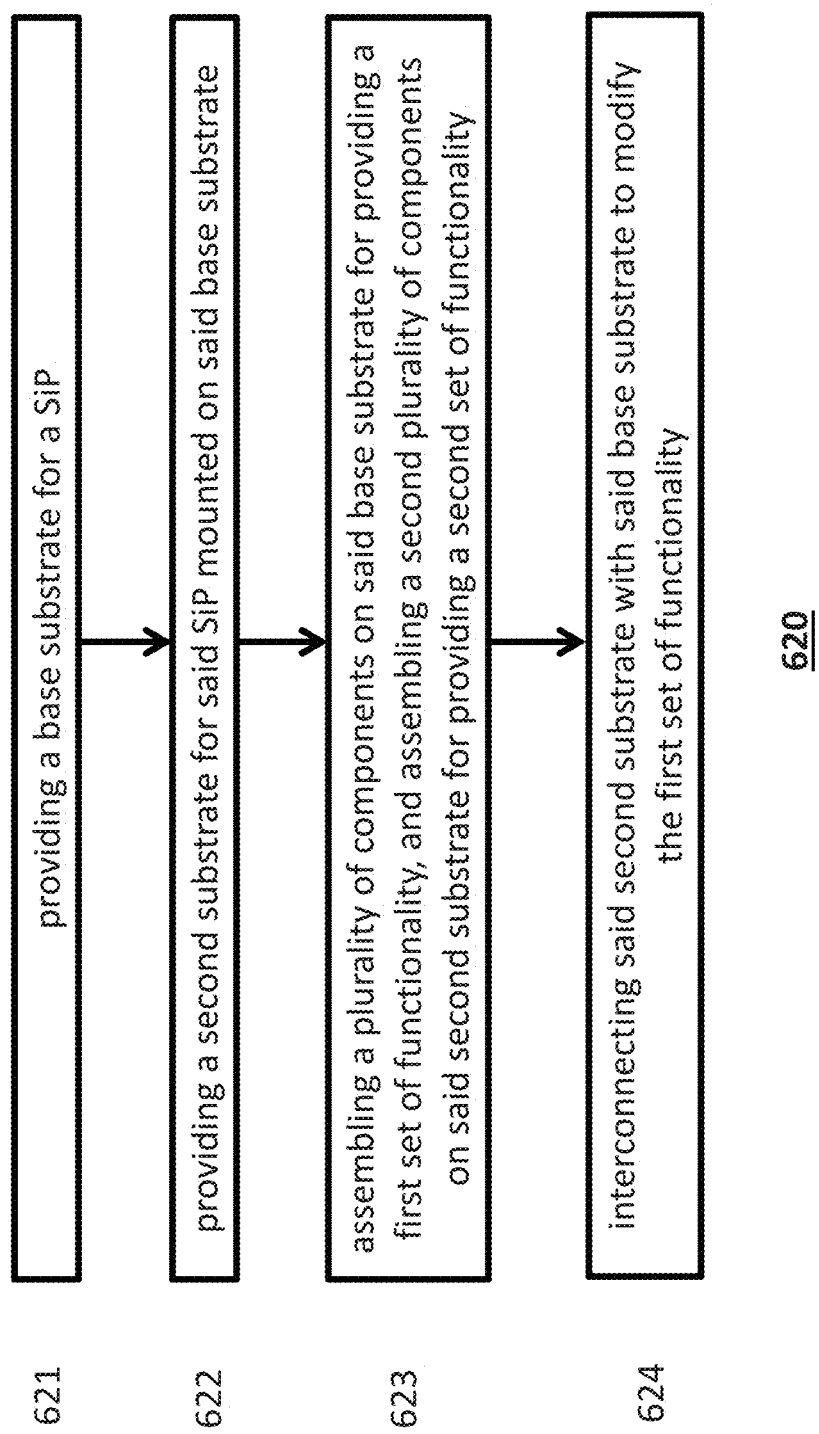
Figure 6C:
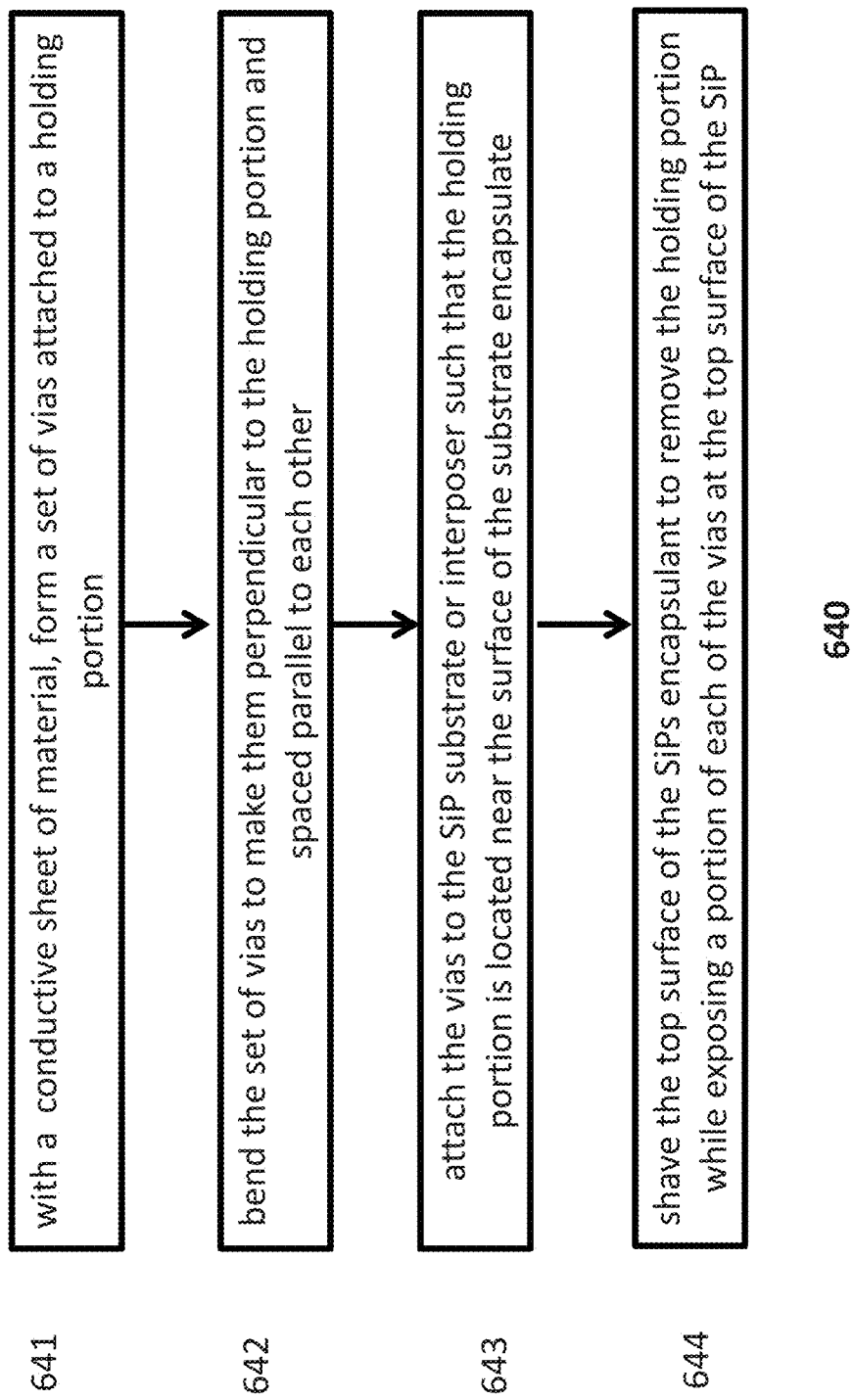

FIGS. 6A, 6B and 6C depict methods for manufacturing a SiP using multiple substrates with risers. FIG. 6A depicts a method for manufacturing a SiP 600, by providing 601 a base substrate for said SiP, assembling 602 a plurality of components on said base substrate for providing a first set of functionality, assembling 603 a second plurality of components on said second substrate for providing a second set of functionality, assembling 604 a third plurality of components on said third substrate for providing a third set of functionality, and interconnecting 605 one of said second or third substrate with said base substrate using a riser to modify the first set of functionality.

FIG. 6B depicts a method 620 for manufacturing a SiP, by providing 621 a base substrate for said SiP, providing 622 a second substrate for said SiP for interconnecting with said base substrate, assembling 623 a plurality of components on said base substrate for providing a first set of functionality, and assembling a second plurality of components on said second substrate for providing a second set of functionality, and interconnecting 624 said second substrate with said base substrate using a riser to modify the first set of functionality.

FIG. 6C depicts a method 640 of producing a riser 310 having a set of vias, the method beginning with using 641 a metal sheet or other conductive elements comprise a holding portion 425 and portions that are in the form of individual columns 412, and the individual columns are bent 642 to form vias 412 perpendicular to and still attached to the holding portion 425 to secure the vias in a fixed position during manufacturing 643, particularly before and during molding, and finally a portion of the SiPs encapsulant including the holding portion is removed by shaving or other means to expose 644 a portion of each of the vias at the top surface of the SiP.

Accordingly, it may be seen that the present disclosure provides SiP embodiments with any desired connector arrangement on an exterior surface of a packaged SiP allowing for attachment of various modules or devices to a packaged SiP that modify the functionality of or operations performed by that packaged SiP.

In summary, one aspect of the present disclosure is to provide an area on a primary (or main) SiP substrate that allows for a customizable second package or device to be interconnected with the components of a packaged SiP to allow for modifications to the functionality of the SiP. This area may have a fixed number of I/O and power supply ports in a pre-determined fixed pattern on an exterior surface of the SiP package. This area can then be populated with a plurality of different secondary packaged components or devices. These secondary packaged components or devices will have a pattern of external electronic connectors on their bottom side to match the pre-determined pattern of electrical connectors on the SiP's top exterior surface. The top side of any such secondary packaged components or devices may also be designed in a pattern or physical arrangement to accept the external connectors of different components and functional blocks. This will allow the top side to be customized depending on the additional functionality or capabilities a particular application requires. Some of these functionalities or capabilities are, for example and not limited to, WIFI, video, accelerometer, temperature, pressure sensors, security function, or even a general purpose bread-board.

The present disclosure provides a method for manufacturing a SiP, that includes providing a base substrate for said SiP, assembling a plurality of components on said base substrate for providing a first set of functionality, providing a second substrate for said SiP, assembling a second plurality of components on said second substrate for providing a second set of functionality, providing a third substrate for said SiP, assembling a third plurality of components on said third substrate for providing a third set of functionality, and interconnecting one of said second or third substrate with said base substrate using a riser structure to modify the first set of functionality.

The present disclosure also provides a method for manufacturing a SiP, that includes providing a base substrate for said SiP, providing a second substrate for said SiP, assembling a plurality of components on said base substrate for providing a first set of functionality, and assembling a second plurality of components on said second substrate for providing a second set of functionality, and externally interconnecting said second substrate with said base substrate using a riser structure to modify the first set of functionality.

The present disclosure further provides a method of producing a riser structure having a set of vias using a metal sheet or other conductive elements that are in the form of individual columns, and all columns are attached to a holding plate or strip to facilitate holding the vias in a fixed position during manufacturing, particularly before and during molding.

In some instances, the one or more embodiments disclosed above may further comprise the one or more embodiments disclosed below.

Figure 7:
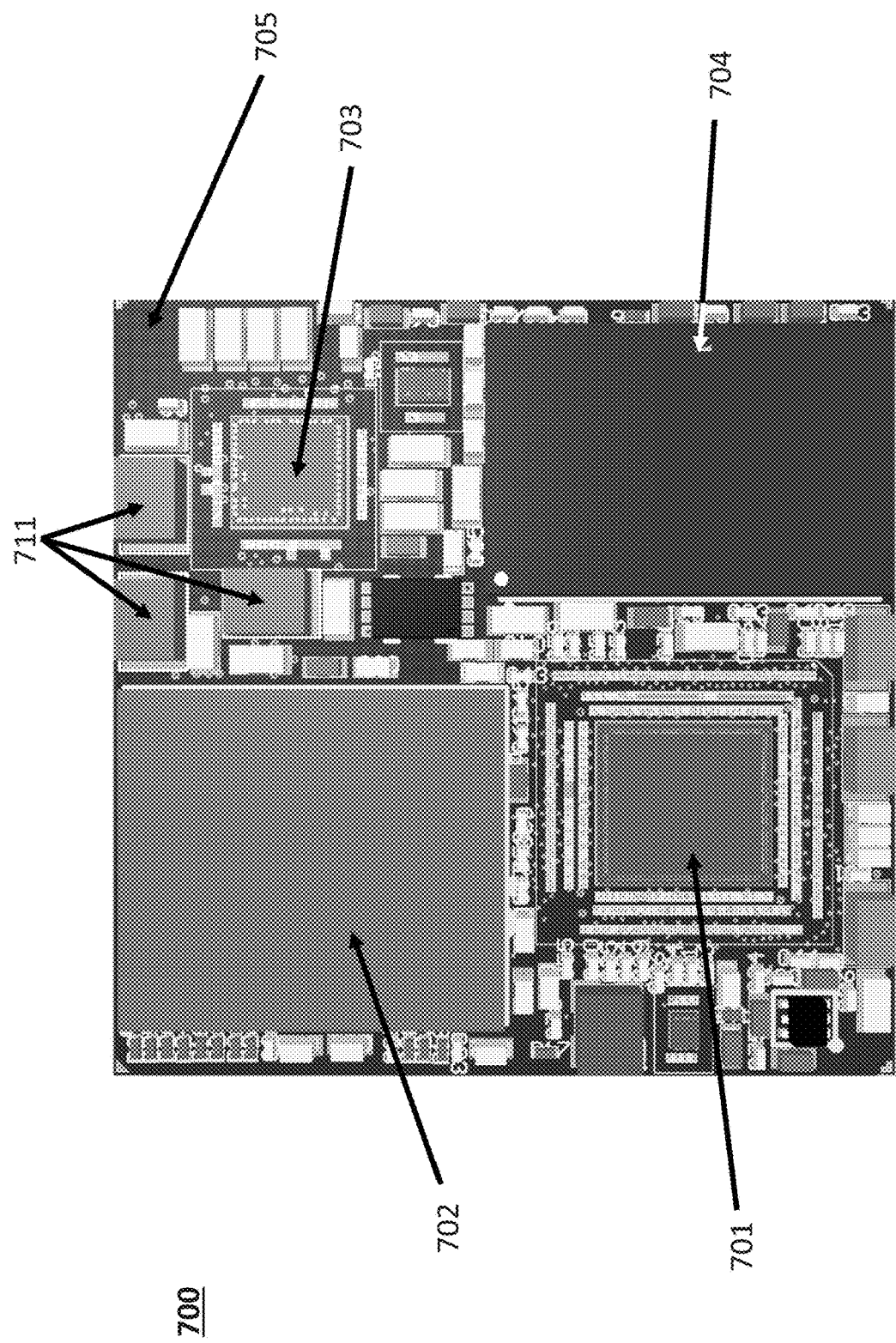
FIG. 7 depicts a top view of a SiP device with a mezzanine device according an embodiment.

FIG. 7 depicts a mezzanine device used in a base SiP system along with other components according to one embodiment. This example of a SiP 700 has multiple components electrically and mechanically connected to the SiP's base substrate 705. In this example the components include a microprocessor 701, mezzanine component 702, power management integrated circuit (PMIC) 703, a memory device 704, and various other unlabeled components 711. A designer defines how the SiP 700 operates as a unique system to perform desired functions.

FIGS. 8A and 8B depict a floor plan 800 of the SiP system 700 similar to that shown in FIG. 7. FIG. 8A, in addition to the processor 701, mezzanine device 702, PMIC 703, and memory device 704, illustrates further details of how the external connectors 812 of a mezzanine device may be arranged and configured when viewed through the mezzanine component 702. Although these external connectors are illustrated as a ball grid array (BGA), they may also be wire bond connections (not shown).

FIG. 8B depicts a side view 850 of the SiP system 700 of FIG. 8A. The side view is taken from the view point of line AA 820 of FIG. 8A. The mezzanine device 702 is shown including its external connectors 812 which electrically and mechanically connect it to the SiP system base substrate 705. Also attached to the SiP substrate 705 is the PMIC 703. In this depiction, the PMIC 703 is electrically connected to the substrate 705 using wire bonds 851. In addition to using bond wires, devices on the SiP substrate 705 may be attached using flip chip technology (not shown) or surface mount technology (SMT).

FIGS. 8C and 8D depict 870, 880 the same floor plan as in FIGS. 8A and 8B except the mezzanine component 702 is electrically attached to the base substrate 705 using bond wires 873 which electrically connect wire bond landing pads 871 on the mezzanine component 702 with the wire bond landing pads 872 on the system base substrate 705. For simplicity of depiction purposes, wire bond landing pads are only shown on one edge of the mezzanine component 702, but may be distributed on or along any of the four edges of the mezzanine component 702 or all of them.

FIGS. 9A and 9B depict the mezzanine device 702, including the attachment of various active 902 and passive components 903, and its attachment using connectors 812 to a SiP system base substrate 705 according to some embodiments. The active device 902 may be electrically connected to the mezzanine substrate using various techniques, such as, for example, but not limited to, bond wires 951, using a BGA, using flip chip technology, or other similar techniques. In FIG. 9B, which shows a side view 900, the mezzanine device 702 has been designed such that it may be electrically and mechanically connected to the same substrate 705 as shown in FIG. 8B using a BGA 812 or bond wires (not shown in FIG. 9B).

FIG. 10A depicts how the mezzanine device 702 from the first SiP design 700 may be removed 1011 and replaced 1012 by a second mezzanine device such as 1002A giving the SiP 700 new functions uniquely different from those given by the first mezzanine device 702 according to some embodiments. By doing this, the same base SiP system 700 may be used to create a family of unique devices based on which mezzanine device 1002x (that is 1002 A, B, C, etc.) is chosen from a family of compatible mezzanine devices. Unique variations could include such things as for example, but not limited to, additional memory devices, wireless or wire-lined communications circuits, security circuits, Field Programmable Gate Arrays (FPGAs), Field Programmable Analog Arrays (FPAAs), sensors, and/or analog interface devices, to name a few.

FIG. 10B depicts a side view of the system substrate 705 with the mezzanine device 1002A attached. Finally, the external connectors (that is the ball grid array) 815 of the system base substrate is depicted.

Figure 11:
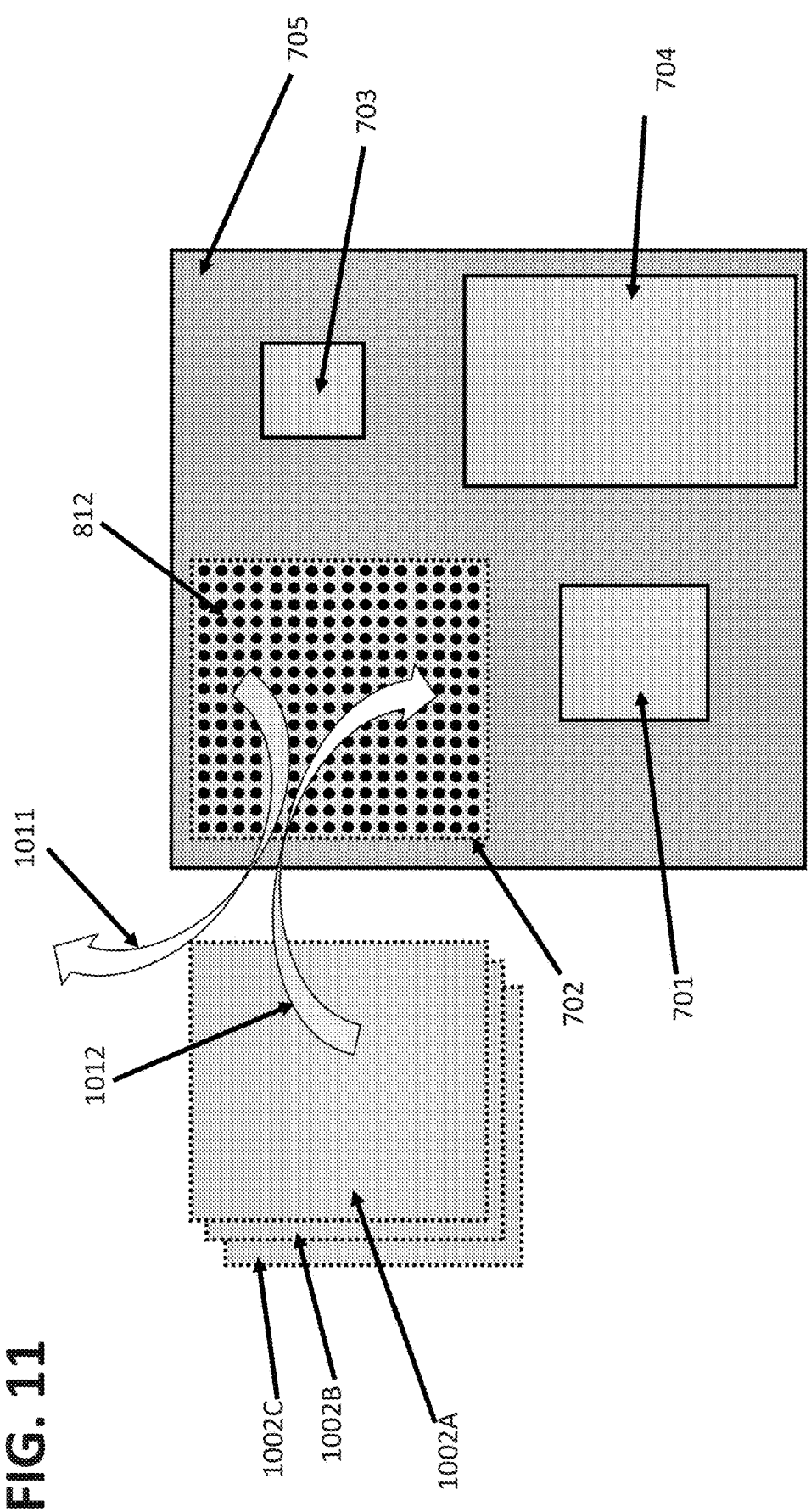
FIG. 11 depicts the replacement of one mezzanine device with either a second or third mezzanine device on a SiP base substrate according to an embodiment.

FIG. 11 depicts a simplified version of FIG. 10 from the viewpoint of the floor plan of the SiP base substrate 705 for a SiP system 700. In summary the mezzanine device 702 from a first SiP design 700 may be removed 1011 and replaced 1012 by a second mezzanine device 1002A giving the SiP new functions different from those given by the first mezzanine device 702. Note either 1002A, 1002B or 1002C may be used as the replacement mezzanine device depending on the function(s) to be added or modified.

FIGS. 12A and 12B depict how a mezzanine component 1002 may be attached to a packaged SiP 1201 according to some embodiments. FIG. 12A depicts how a mezzanine device from the first SiP design 702 but now attached to the top surface of the SiP 1201 may be removed 1205 and replaced 1204 by a second mezzanine device such as 1002A giving the packaged SiP 1201 new functions uniquely different from those given by the first mezzanine device 702. 1002A, 1002B or 1002C may be used as the replacement mezzanine device depending on the function(s) to be added. By doing this, the same packaged base SiP system 1201 may be used to create a family of unique devices based on which mezzanine device 1002 x (that is 1002 A, B, C, etc.) is chosen from a family of compatible mezzanine devices. Unique variations may include such things as for example, but not limited to, additional memory devices, wireless or wire-lined communications circuits, security circuits, Field Programmable Gate Arrays (FPGAs), Field Programmable Analog Arrays (FPAAs), sensors, and/or analog interface devices, to name a few.

FIG. 12B depicts a side view of the packaged system substrate 705 with the mezzanine device 1002A attached. Finally, the external connectors (that is the ball grid array) 815 of the system base substrate is depicted, along with via risers 1202 which serve to move the contactor interfaces for the base substrate 705 to an external surface of the packaged SiP 1201. These substrate contactors on the surface of the package allow for continued use of a mezzanine device, even though the SiP is packaged. Also, in some embodiments, the mezzanine device 1002A may be packaged, as well and result in a package on package (POP). When both are packaged, the contacts for making connections between the substrate and the mezzanine may be made with socketed connectors.

Although not depicted in FIG. 12B, two modifications or options using via risers may be used according to some embodiments. One such modification is to have a mezzanine component 702 included inside the SiP package 1201 (like that depicted in FIG. 10B) that utilizes a portion of the available interconnections with the base substrate 705 and the remaining interconnections to the base substrate 705 use via risers (as depicted in FIG. 12B) to move the interconnections to the surface of the package 1201 (as depicted in FIG. 12B), where the via risers bypass the mezzanine component 705 in the package 1201. The other modification is to have a mezzanine component 702 included inside the SiP package 1201 (like that depicted in FIG. 10B) and have the via risers 1202 extend from the upper surface of the mezzanine device 705 inside the package 1201 to the surface of the package 1201 (as depicted in FIG. 12B). These modifications also allow the use of a packaged SiP and a packaged mezzanine component to be operatively interconnected.

Figure 13B:
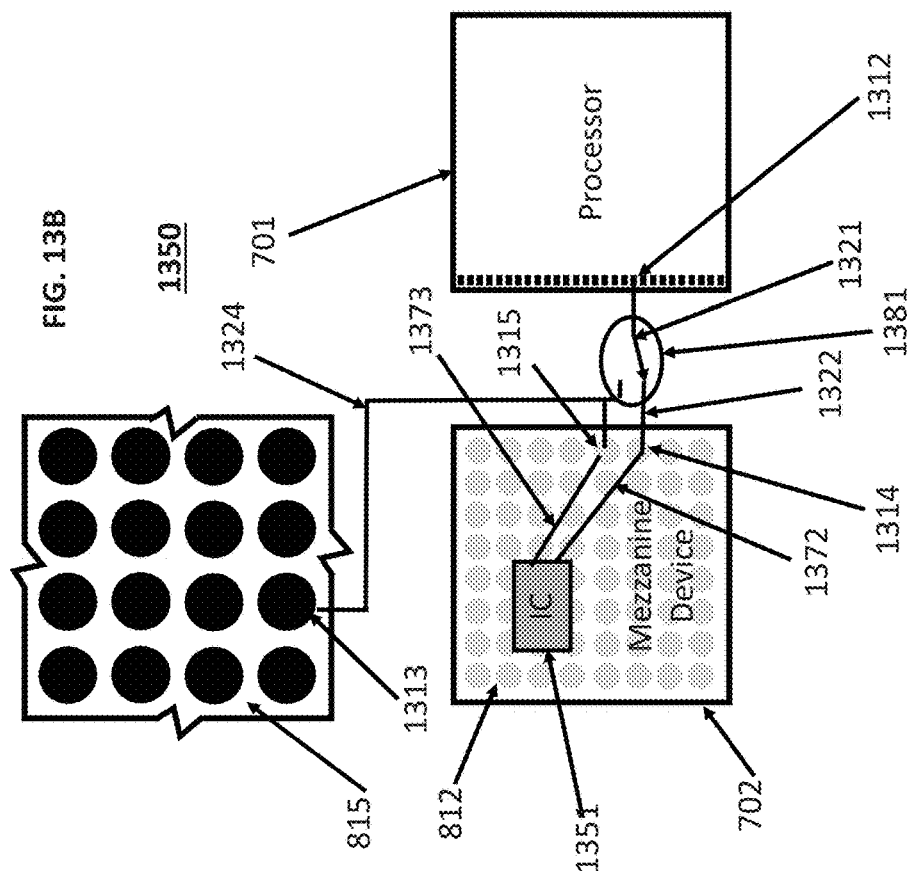
FIGS. 13A and 13B depict different types of connections between SiP mezzanine component output connectors and a SiP base substrate I/O connector according to some embodiments.
Figure 13A:
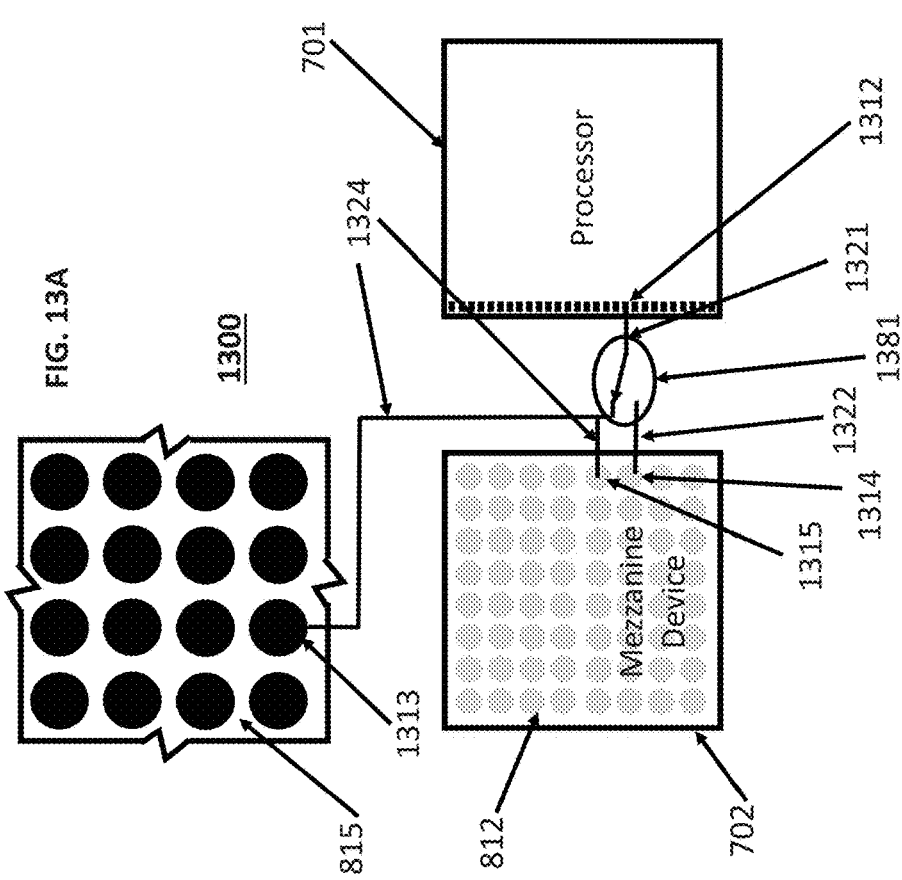

FIGS. 13A and 13B depict two different connection paths between a connection of a component or device 701, such as a processor, a mezzanine device 702 and an I/O connector 1313 on or in the base substrate 705 of the SiP system 700 according to some embodiments. For ease of explanation purposes only the three interconnected components of the SiP system 700 are depicted as separate blocks in FIGS. 13A and 13B.

Referring now to embodiment 1300 of FIG. 13A the specific connection pad 1312 of the processor 701 is connected to the input of a single pole double throw (SPDT) analog switch 1381 by a trace 1321 on the base substrate 705 (not shown) of the SiP 700. One of the outputs of the switch 1381 is connected to an external connecter 1314 of the mezzanine device via a signal trace 1322 on the SiP base substrate 705 (not shown). The other output of the analog switch 1381 is connected to one of the external connectors 1313 of the external connection array 815 of the SiP 700. As shown in FIG. 13A the SPDT switch is oriented in such a way that the I/O pad 1312 of the processor 701 is directly connected to the external connector 1313 of the external connection array 815 of the SiP 700 by electrically connecting signal traces 1321 and 1324. Additionally, the external connection 1314 of the mezzanine device 702 is not connected to the I/O pad 1312 of the processor 701. Note however that, 1315 is so connected. In this example a SPDT analog switch 1381 has been used. Other alternative devices may be used to make such connections, including, for example, but not limited to, a properly placed zero ohm resistor or bond wire connected between the two signal traces 1321 and 1324.

In another embodiment 1350, as shown in FIG. 13B, the SPDT switch is oriented in such a way that the I/O pad 1312 of the processor 701 is directly connected to the external connector 1314 of the mezzanine device connection array 812 by electrically connecting signal traces 1321 and 1322. Additionally, the external connection 1315 of the mezzanine device 702 is connected to the external connector 1313 of the external connection array 815 of the SiP 700 (not shown) by way of signal trace 1324. As in FIG. 13A, it should be noted that in this example a SPDT analog switch 1281 has been used. According to embodiments, other devices may be used to make such a connection, including, for example, but not limited to, a properly placed zero ohm resistor or bond wire connected between the two signal traces 1321 and 1324. FIG. 13B illustrates passage of a signal from a device or component (processor) 701 on a SiP base substrate to a device or component 1351 on a mezzanine substrate 702 and then an output from that device or component 1351 on a mezzanine substrate 702 to external connector 1313 via signal trace 1373, external connector 1315 of the mezzanine device connection array 812, and by signal trace 1324 as an output for the SiP, or alternatively the device or component (processor) 701 signal is provided as an output from the SiP.

Figure 14:
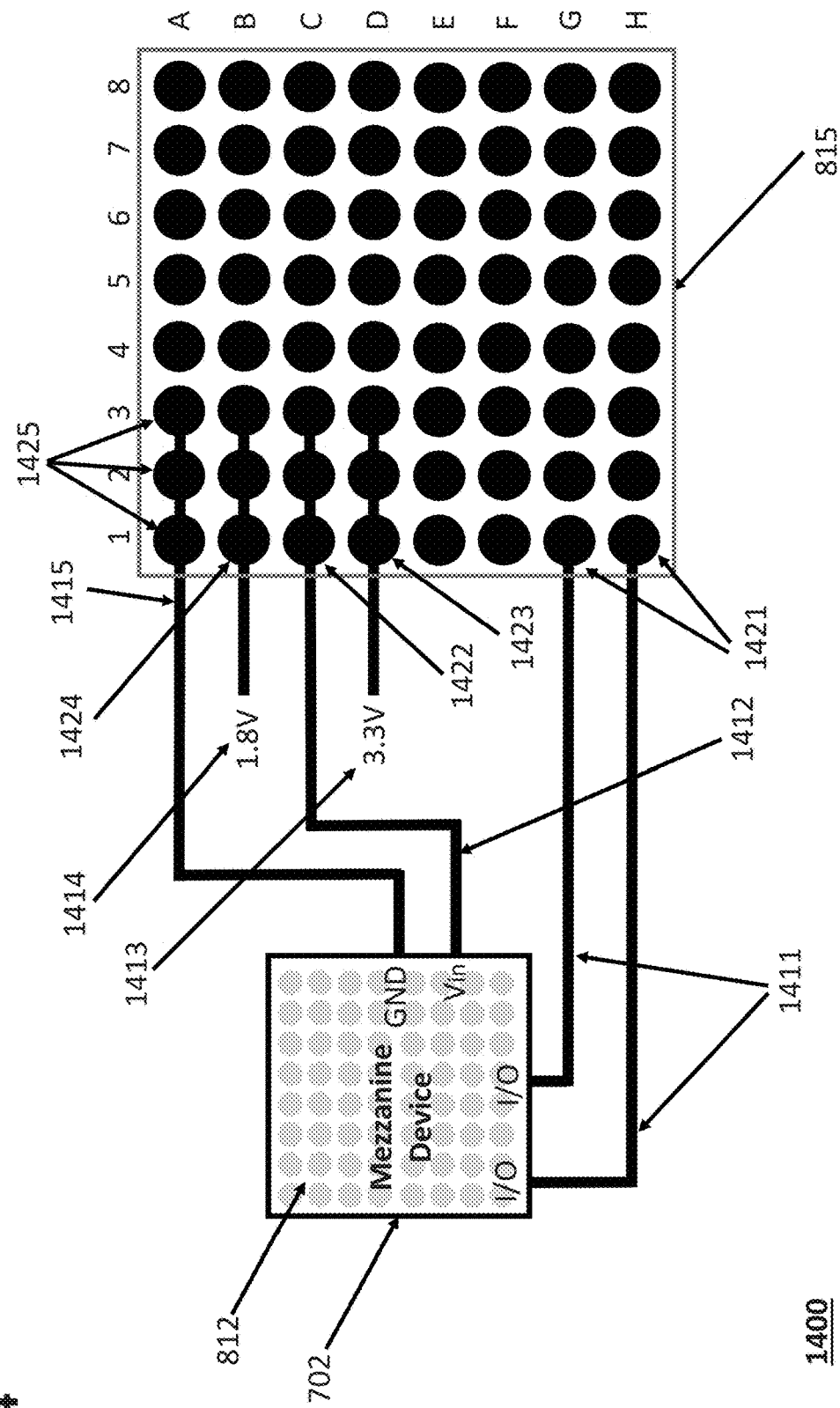
FIG. 14 depicts an example of connections between a SiP base substrate I/O connectors and the external connectors of a mezzanine device mounted on the SiP base substrate according to an embodiment.

FIG. 14 depicts 1400 a simplified example of the external connections between the external connectors 1421, 1422, 1423, 1424 and 1425 of the SiP's external connection array 815 on the base substrate 705 of the SiP 700 and the external connectors of the mezzanine device 702 via signal traces 1411, 1412 and 1415 according to some embodiments. Specifically, external ground connectors 1425 are connected to the ground external connectors (GND) of the Mezzanine device 702. Likewise external signal connectors 815 on the SiP's base substrate 705 are connected to the appropriate I/O external connectors of the mezzanine device 702.

Finally, FIG. 14 depicts the ability for the mezzanine device to be powered by two different voltage rails 1413 or 1414 by embedding the mezzanine device 702 Vin electrical connection trace 1412. By connecting the external connectors (either those attached to 1414 or 1413) of the SiP's substrate 705 to the external connectors attached to the Vin trace 1412, the appropriate voltage to the mezzanine device 702 may be selected.

Figure 15:
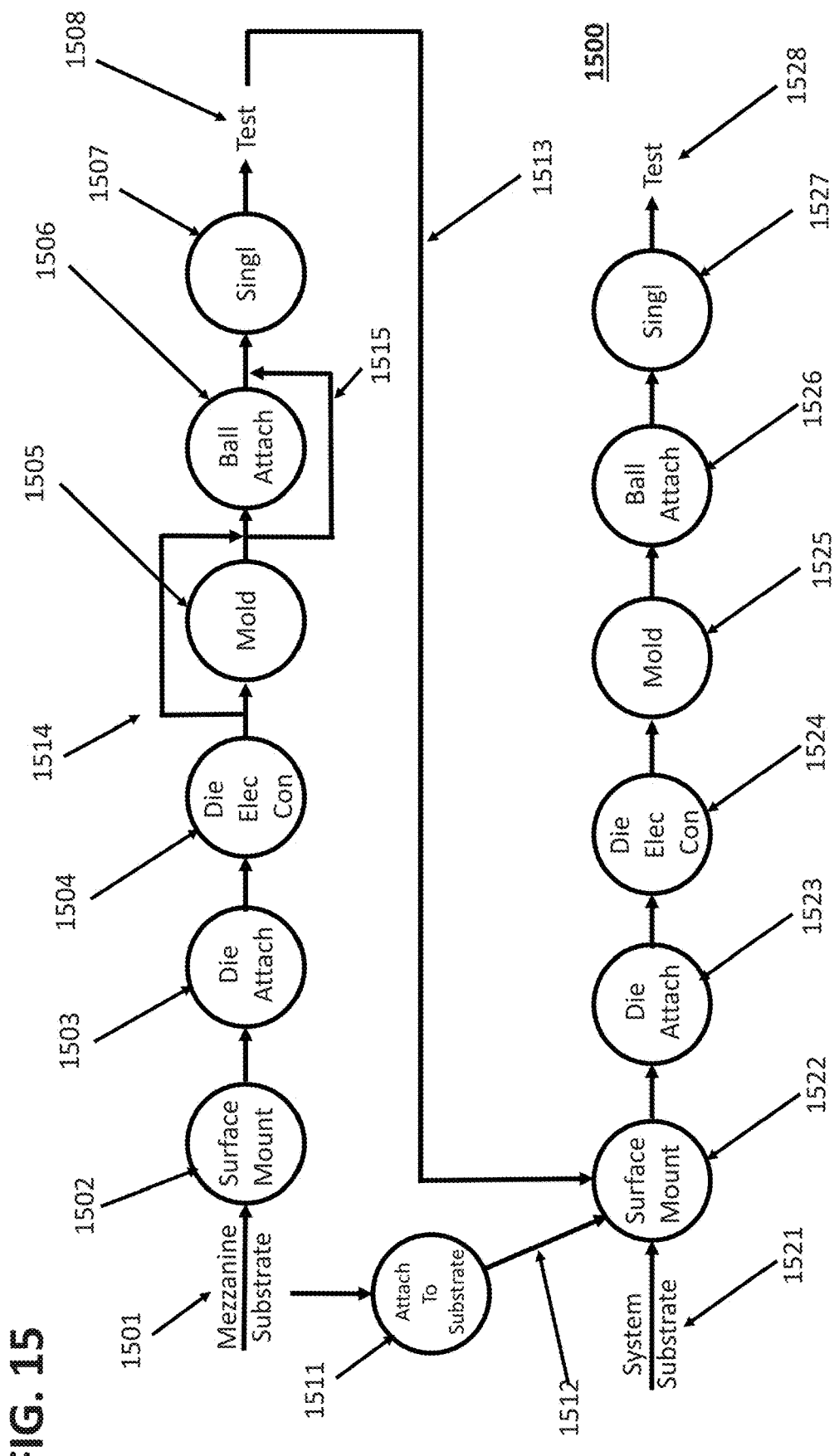
FIG. 15 depicts a production flow according to some embodiments.

FIG. 15 depicts a simplified representation of a manufacturing flow 1500. This flow may be used, according to embodiments, for a mezzanine device starting in step 1501. This flow may be used, according to embodiments, for a SiP system base substrate starting in step 1521. The flow 1500 further illustrates how they may be interconnected according to some embodiments. As both the mezzanine device and SiP system base substrates will generally have the same process flow, which starts with the two substrates, in steps 1501 and 1521 respectively, introduced to the production line, the steps in sequence are the attaching of surface mount (SMT) devices to the substrates in steps 1502, 1522. The next step is to attach to the substrates any integrated circuit die in steps 1503 and 1523. After being attached, the die is electrically connected to the appropriate substrate either by flip chip techniques or by using bond wires in steps 1504 and 1524. Next the component attachment process is complete and the substrate is encapsulated in steps 1505 and 1525 followed by the attachment of the external electronic connectors. In this example balls are attached to the bottom surface of the substrates in steps 1506 and 1526. As the substrates are processed in batches where multiple substrates are on a panel in some embodiments, after the mold and ball attach processes the panels are cut apart into individual devices in steps 1507 and 1527. The final step of the process is the production test where the non-functional devices are eliminated in steps 1508 and 1528.

Once the mezzanine devices have completed their assembly process they are ready to be attached to the SiP system base substrate in step 1513. There are several optional methods that may be employed. The first of these methods is to attach in step 1511 the mezzanine substrate in step 1501 to the SiP system base substrate in step 1521. Once attached, the mezzanine components along with the base substrate components are attached as part of the SiP system base substrate process flow in steps 1522-1528.

A second method assembles the mezzanine device as described in the previous paragraph in steps 1502-1508, except that the mold step 1505 is skipped 1514. A third method further skips both the mold step 1505 and the ball attach step 1515. Another alternative would be to skip ball attach step 1515 while not skipping the mold step 1505.

All of the above variants may be use for a specific combination of mezzanine device and SiP system. Although the process flow 1500 in FIG. 15 is depicted as a continuous process flow, it should be noted that the mezzanine substrate assembly process in steps 1502-1508 may occur at any time and totally independent of the system substrate assembly process in steps 1522-1528. That is the overall process step 1513 may be separated into the two assembly processes by long periods of time in order to optimize the overall assembly process of the manufacturer.

FIGS. 16 A-E depict methods (1600, 1620, 1640, 1660, 1680) for creating a unique system SiP 700 by attaching the mezzanine component 702 or 1002A, B or C to the system substrate 705 as part of the assembly process 1500 according to some embodiments. According to embodiments, the steps of methods 1600, 1620, 1640, 1660, and 1680 may correspond to one or more steps of flow 1500, as indicated in the respective figures.

Figure 16A:
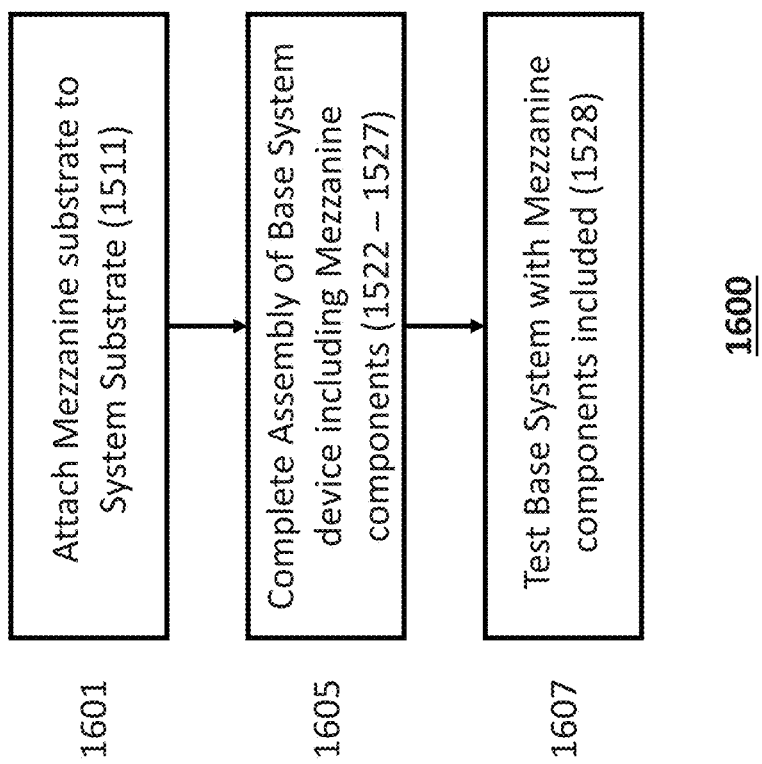
FIGS. 16A-16E depict methods for assembling a system SiP with a mezzanine component according to some embodiments.

Now referring to FIG. 16A, the unique system SiP 700 is assembled and tested by attaching the mezzanine substrate to the system substrate in step 1601, followed by the assembly of the base system device including the mezzanine component in step 1605. Finally the unique system SiP is tested in step 1607.

Figure 16B:
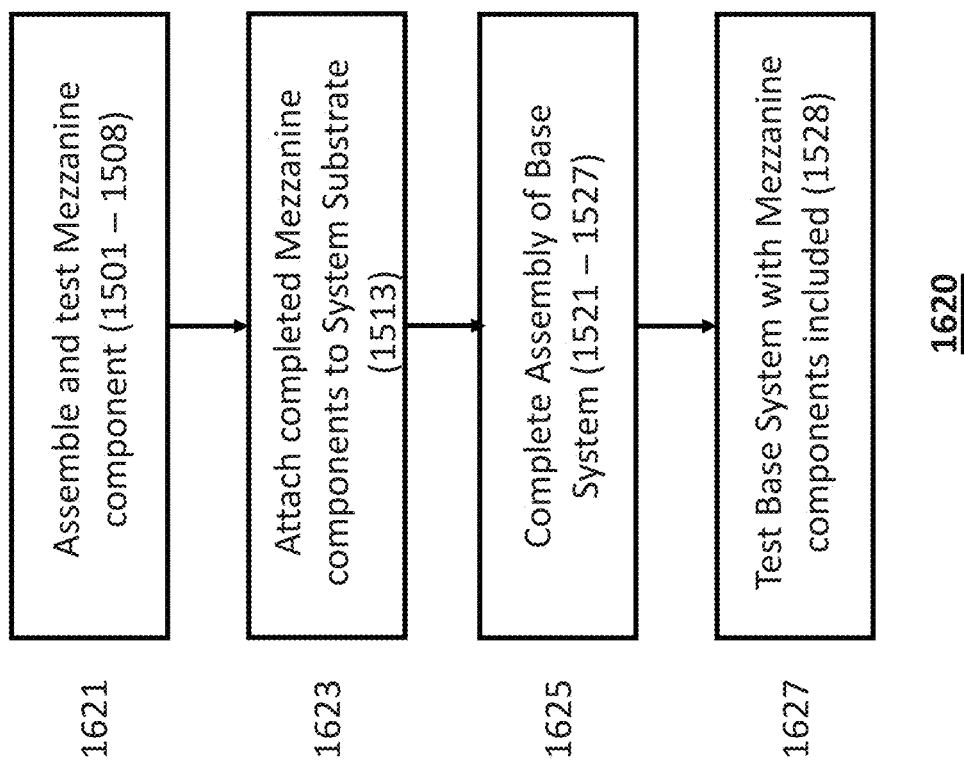

FIG. 16B depicts a method in which the mezzanine component 702 is first assembled and tested in step 1621 prior to being attached to the system substrate in step 1623 as part of the assembly process of the unique system SiP in step 1625. Finally the unique system SiP is tested in step 1627.

Figure 16C:
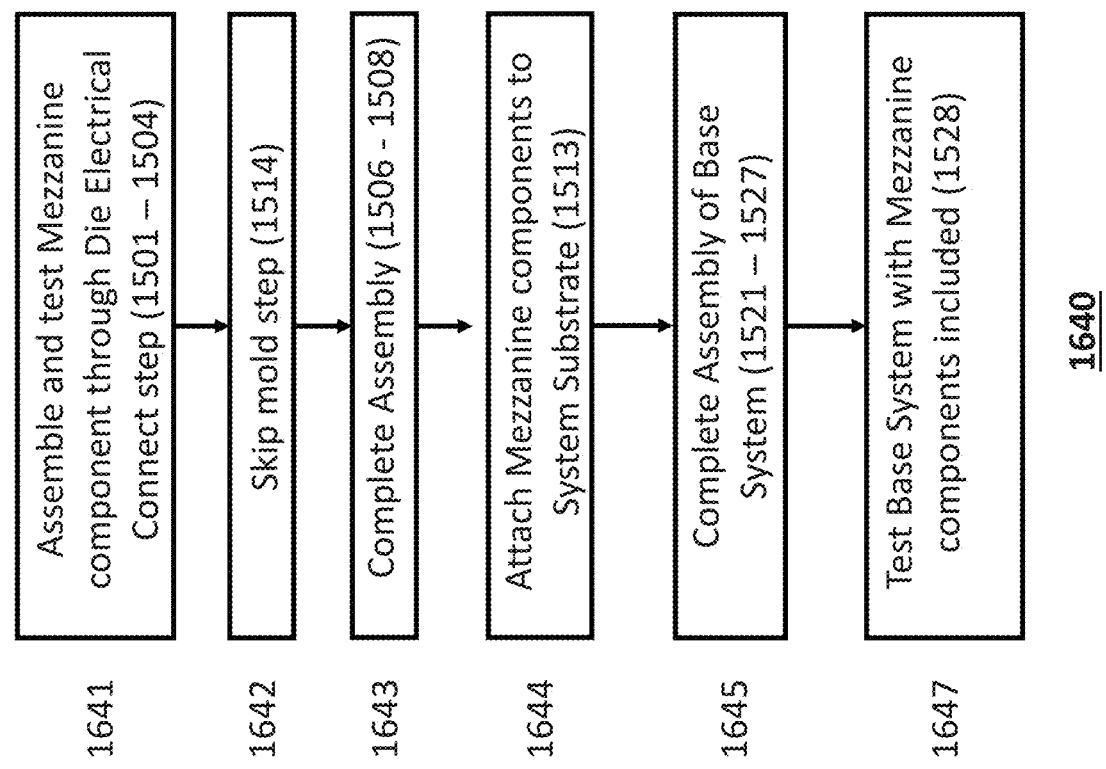

FIG. 16C depicts a method similar to the method shown in FIG. 16B. In this method the mold step of the mezzanine component 702 assembly process is skipped (see FIG. 15 step 1514) in step 1642. The remaining assembly and test steps are then completed in step 1643. Once completed the mezzanine component 702 is attached to the system substrate in step 1644 as part of the unique system SiP assembly process in step 1645. Finally the unique system SiP is tested in step 1647.

Figure 16D:
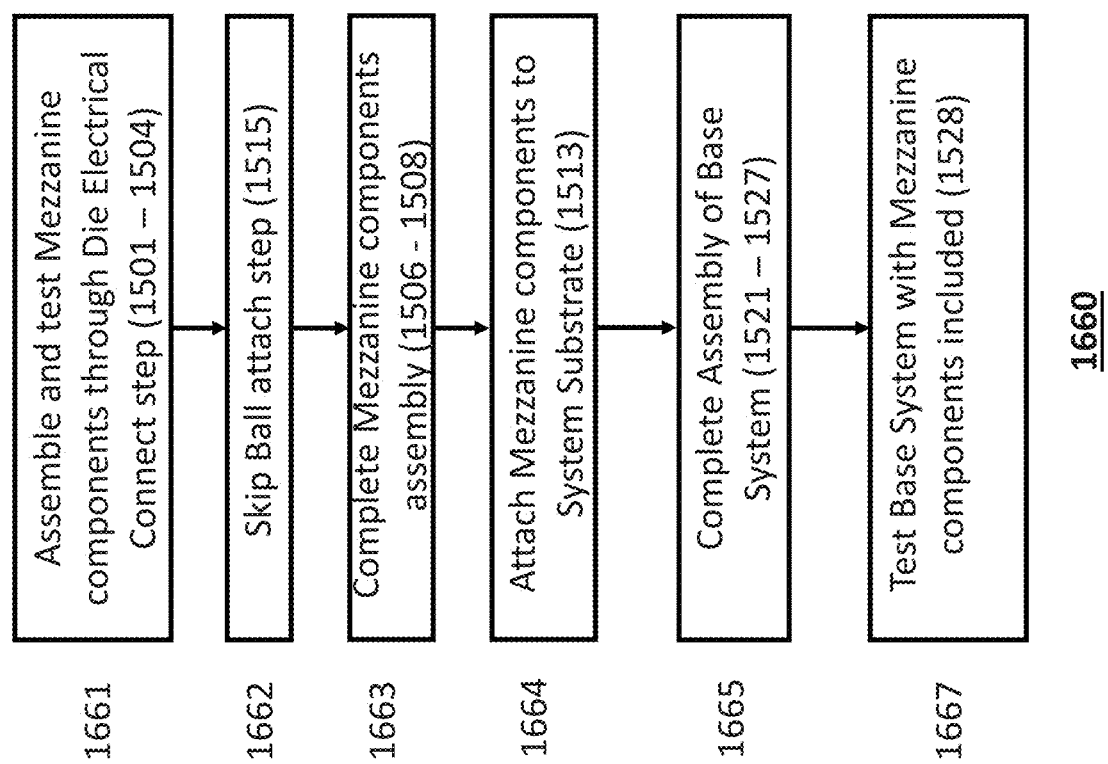

FIG. 16D depicts a method similar to the method shown in FIG. 16B. In this method the ball attach step of the mezzanine component 702 assembly process is skipped (see FIG. 15 step 1515) in step 1662. The remaining assembly and test steps are then completed in step 1663. Once completed the mezzanine component 702 is attached to the system substrate in step 1664 as part of the unique system SiP assembly process in step 1665. Finally the unique system SiP is tested in step 1667.

Figure 16E:
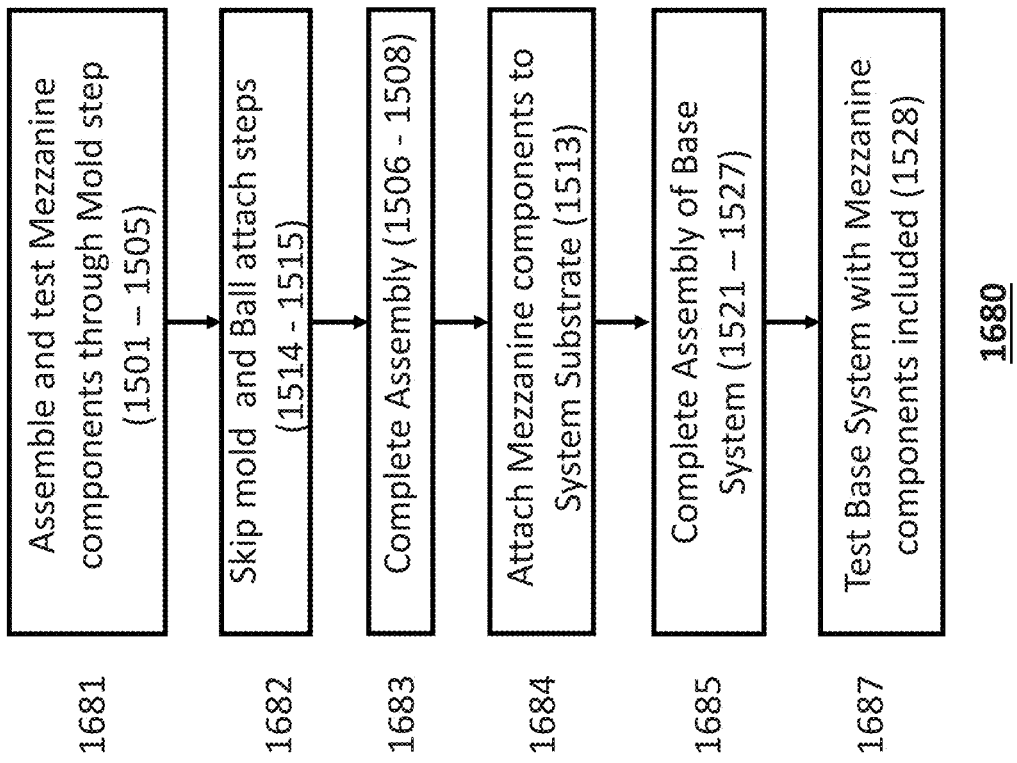

FIG. 16E depicts a method similar to the method shown in FIG. 16B. In this method both the mold and the ball attach steps of the mezzanine component 702 assembly process is skipped (see FIG. 15 step 1514 and 1515) in step 1682. The remaining assembly and test steps are then completed in step 1683. Once completed the mezzanine component 702 is attached to the system Substrate in step 1684 as part of the unique system SiP assembly process in step 1685. Finally the unique system SiP is tested in step 1687.

Aspects of the disclosure may be understood and further illustrated by the following numbered embodiments.

Embodiment Number 1. A System in a Package (SiP), comprising: a base substrate having multiple layers with etched conductive paths and multiple vias associated therewith for making interconnections and having conductive pads for additional interconnections; a plurality of components mounted on said base substrate and operatively interconnected using said vias and conductive paths; an area of said base substrate suitable for operatively mounting a second substrate wherein said second substrate has connective pads for making external connections to said base substrate; and conductive paths to make operative interconnections between said base substrate and said external connective pads of said second substrate, wherein said second substrate contains a plurality of operatively interconnected components for modifying the functionality of said components mounted on said base substrate.

Embodiment Number 2. A SiP of embodiment 1 wherein said external connective pads of said second substrate comprise a ball grid array for interconnecting with said base substrate.

Embodiment Number 3. A SiP of embodiment 1 wherein said modified functionality comprises one or more of additional memory devices, wireless or wire-lined communications circuitry, security circuitry, Field Programmable Gate Arrays (FPGAs), Field Programmable Analog Arrays (FPAAs), sensors, video and analog interface devices.

Embodiment Number 4. A SiP of embodiment 1 wherein said conductive pads of said base substrate are arranged in a first pattern and said connective pads of said second substrate are arranged to operatively interface with said conductive pads in said pattern.

Embodiment Number 5. A SiP of embodiment 1 wherein said base substrate and associated components and said second substrate and associated components are encapsulated.

Embodiment Number 6. A SiP of embodiment 1 wherein said base substrate and associated components are encapsulated and said second substrate and associated components are separately encapsulated.

Embodiment Number 7. A SiP of embodiment 1 wherein said base substrate and associated components and said second substrate and associated components are encapsulated, and further comprising a third substrate and associated components is encapsulated.

Embodiment Number 8. A SiP of embodiment 7 wherein said encapsulated base substrate, associated components, second substrate, associated components and said encapsulated third substrate and associated components are appropriately interconnected.

Embodiment Number 9. A SiP, comprising: a base substrate having multiple layers with multiple etched conductive paths and multiple vias associated therewith for making interconnections with and between components mounted thereon, and having a plurality of conductive pads arranged on a surface in a pattern for making additional interconnections, a plurality of components mounted on said base substrate and operatively interconnected using said vias and conductive paths; a second substrate having a plurality of connective pads for making external connections; and conductive paths individually attaching each of said plurality of external connective pads of said second substrate individually to each of a first plurality of said plurality of conductive pads of said base substrate, wherein said second substrate contains a plurality of components operatively interconnected for modifying the functionality of said plurality of components mounted on said base substrate.

Embodiment Number 10. A System in a Package (SiP), comprising: a base substrate having multiple layers with etched conductive paths and multiple vias associated therewith for making interconnections and having conductive pads for making additional interconnections; a plurality of components mounted on said base substrate and operatively interconnected using said vias and conductive paths; an area of said substrate suitable for operatively mounting a second substrate wherein said second substrate has connective pads for making external connections; and conductive paths to make operative interconnections between said base substrate and said external connective pads of said second substrate, wherein said second substrate has multiple layers with etched conductive paths and multiple vias associated therewith for making interconnections for a plurality of operatively interconnected components mounted thereon for modifying the functionality of said components mounted on said base substrate.

Embodiment Number 11. A SiP of embodiment 10, wherein said conductive pads of said base substrate are arranged in a first pattern and said connective pads of said second substrate are arranged in a pattern to operatively interface with said first pattern.

Embodiment Number 12. A SiP of embodiment 10, wherein said conductive pads of said base substrate are arranged in an area on said base substrate top surface suitable for operatively mounting a different substrate.

Embodiment Number 13. A SiP, comprising: a base substrate having multiple layers with multiple etched conductive paths and multiple vias associated therewith for making interconnections with and between components mounted thereon and having conductive pads arranged on a top surface for additional interconnections; a plurality of components mounted on said base substrate and operatively interconnected using said vias and conductive paths, a second substrate containing a plurality of operatively interconnected components and having connective pads for making external connections to an area of said base substrate top surface suitable for operatively mounting to said conductive pads; and wire bonds for interconnecting said base substrate conductive pads with said second substrate external connective pads, wherein said second substrate contains components operatively interconnected for modifying the functionality of said plurality of components mounted on said base substrate.

Embodiment Number 14. A SiP of embodiment 1 wherein said base substrate further comprises a plurality of connectors disposed on a surface of said base substrate for making external connections.

Embodiment Number 15. A SiP of embodiment 1 wherein said conductive paths comprise bond wires.

Embodiment Number 16. A SiP of embodiment 1 wherein said base substrate further comprises at least a first plurality of connectors disposed on a surface of said base substrate for making operative external connections with one or more secondary substrates.

Embodiment Number 17. A SiP of embodiment 5 wherein said base substrate further comprises at least a first plurality of connectors disposed on a surface of said base substrate for making operative external connections with one or more secondary substrates.

Embodiment Number 18. A SiP of embodiment 7 wherein said second substrate further comprises at least a first plurality of connectors disposed on a surface of said second substrate for making operative external connections with one or more secondary substrates.

Embodiment Number 19. A SiP of embodiment 8 wherein said base substrate further comprises at least a first plurality of connectors disposed on a surface of said base substrate for making operative external connections with one or more secondary substrates.

Embodiment Number 20. A method for manufacturing a System in Package (SiP) comprising: providing a base substrate for said SiP; assembling a plurality of components on said base substrate for providing a first set of functionality; providing a second substrate for said SiP; assembling a second plurality of components on said second substrate for providing a second set of functionality; providing a third substrate for said SiP; assembling a third plurality of components on said third substrate for providing a third set of functionality and; interconnecting one of said second or third substrate with said base substrate to modify the first set of functionality.

Embodiment Number 21. The method of embodiment 20, further comprising encapsulating said base substrate and said interconnected second or third substrate to create said SiP.

Embodiment Number 22. The method of embodiment 20, further comprising creating an area on said base substrate for mounting either said second or third substrate.

Embodiment Number 23. The method of embodiment 22, further comprising arranging a plurality of contacts on a surface of said base substrate in a fixed pattern for said mounting area.

Embodiment Number 24. The method of embodiment 20, further comprising packaging said base substrate and components.

Embodiment Number 25. The method of embodiment 20, further comprising packaging each of said second or third substrate and their respective components.

Embodiment Number 26. A method for manufacturing a SiP, comprising providing a base substrate for said SiP; providing a second substrate for said SiP mounted on said base substrate; assembling a plurality of components on said base substrate for providing a first set of functionality, and assembling a second plurality of components on said second substrate for providing a second set of functionality; and interconnecting said second substrate with said base substrate to modify the first set of functionality.

Embodiment Number 27. The method of embodiment 26, wherein said first set of functionality for said base substrate includes one or more of memory devices, wireless or wire-lined communications circuits, security circuits, Field Programmable Gate Arrays (FPGAs), Field Programmable Analog Arrays (FPAAs), sensors, and analog interface devices.

Embodiment Number 28. The method of embodiment 26, wherein said second set of functionality for said second substrate includes one or more of memory devices, wireless or wire-lined communications circuits, security circuits, Field Programmable Gate Arrays (FPGAs), Field Programmable Analog Arrays (FPAAs), sensors, and analog interface devices.

Embodiment Number 29. The method of embodiment 26, wherein said combination of said first set of functionality and said second set of functionality comprises one or more of memory devices, wireless or wire-lined communications circuits, security circuits, Field Programmable Gate Arrays (FPGAs), Field Programmable Analog Arrays (FPAAs), sensors, and analog interface devices.

Embodiment Number 30. A method for manufacturing a SiP, comprising: providing a base substrate for said SiP; assembling a plurality of components on said base substrate for providing a first set of functionality; providing one or more second substrates for said SiP; assembling one or more second plurality of components on one or more of said second substrates for providing one or more second sets of functionality; providing one or more third substrates for said SiP; assembling one or more third plurality of components on one or more of said third substrates for providing one or more third sets of functionality; and interconnecting one or more of one of said second or third substrates with said base substrate to modify the first set of functionality.

Embodiment Number 31. A SiP, comprising: a base substrate comprising multiple layers with multiple etched conductive paths, multiple vias associated therewith for making interconnections with and between components mounted thereon, and a plurality of conductive pads arranged on a surface in a pattern for making additional interconnections; a plurality of components mounted on said base substrate and operatively interconnected using said vias and conductive paths; a second substrate comprising a plurality of connective pads for making external connections; and conductive paths individually attaching each of said plurality of external connective pads to a separate conductive pad of the plurality conductive pads of said base substrate, wherein said second substrate contains a plurality of components operatively interconnected for modifying the functionality of said plurality of components mounted on said base substrate.

Embodiment Number 32. A System in a Package (SiP), comprising: a base substrate comprising multiple layers with etched conductive paths, multiple vias associated therewith for making interconnections, and conductive pads for making additional interconnections; a plurality of components mounted on said base substrate and operatively interconnected using said vias and conductive paths; an area of said substrate suitable for operatively interconnecting with a second substrate, wherein said second substrate comprises connective pads for making external connections; and conductive paths to make operative interconnections between said base substrate and said external connective pads of said second substrate, wherein said second substrate comprises multiple layers with etched conductive paths and multiple vias associated therewith for making interconnections for a plurality of operatively interconnected components mounted thereon for modifying the functionality of said components mounted on said base substrate.

Embodiment Number 33. The SiP of embodiment 32, wherein said conductive pads of said base substrate are arranged in a first pattern and said connective pads of said second substrate are arranged in a pattern to operatively interface with said first pattern.

Embodiment Number 34. The SiP of embodiment 32, wherein said conductive pads of said base substrate are arranged in an area on a top surface of said base substrate suitable for operatively mounting a different substrate.

Embodiment Number 35. A SiP, comprising: a base substrate comprising multiple layers with multiple etched conductive paths, multiple vias associated therewith for making interconnections with and between components mounted thereon, and conductive pads arranged on a top surface for additional interconnections; a plurality of components mounted on said base substrate and operatively interconnected using said vias and conductive paths; a second substrate containing a plurality of operatively interconnected components and connective pads for making external connections to an area on a top surface of said base substrate suitable for operatively mounting to said conductive pads; and wire bonds for interconnecting said base substrate conductive pads with said second substrate external connective pads, and wherein said second substrate comprises components operatively interconnected for modifying the functionality of said plurality of components mounted on said base substrate.

Embodiment Number 36. A method for manufacturing a SiP, comprising: providing a base substrate for said SiP; providing a second substrate for said SiP for interconnecting with said base substrate; assembling a plurality of components on said base substrate for providing a first set of functionality; assembling a second plurality of components on said second substrate for providing a second set of functionality; and externally interconnecting said second substrate with said base substrate using a riser to modify the first set of functionality.

Embodiment Number 37. The method of embodiment 36, wherein said second set of functionality for said second substrate includes the functionality of one or more of: memory devices, wireless or wire-lined communications circuits, security circuits, Field Programmable Gate Arrays (FPGAs), Field Programmable Analog Arrays (FPAAs), sensors, and analog interface devices.

Embodiment Number 38. The method of embodiment 36 wherein said combination of said first set of functionality and said second set of functionality comprises the functionality of one or more of: memory devices, wireless or wire-lined communications circuits, security circuits, Field Programmable Gate Arrays (FPGAs), Field Programmable Analog Arrays (FPAAs), sensors, and analog interface devices.

Embodiment Number 39. The method of embodiment 36, wherein said first set of functionality for said base substrate includes the functionality of one or more of: memory devices, wireless or wire-lined communications circuits, security circuits, Field Programmable Gate Arrays (FPGAs), Field Programmable Analog Arrays (FPAAs), sensors, and analog interface devices.

While various embodiments of the present disclosure are described herein, it should be understood that they have been presented by way of example only, and not limitation. Thus, the breadth and scope of the present disclosure should not be limited by any of the herein above-described exemplary embodiments. Moreover, any combination of the herein above-described elements in all possible variations thereof is encompassed by the disclosure unless otherwise indicated herein or otherwise clearly contradicted by context. Accordingly, other embodiments, variations, and improvements not described herein are not excluded from the scope of the present disclosure. Such variations include but are not limited to new substrate material, different kinds of devices attached to the substrate not discussed, or new packaging concepts.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A packaged System in a Package (SiP) having connectors on an exterior surface of said package for mounting at least one additional device or component, comprising:
   a substrate comprising multiple layers with etched conductive paths, multiple vias associated therewith for making interconnections, and conductive pads on a surface of said substrate for additional interconnections,
   a plurality of components mounted on said substrate and operatively interconnected using said vias and conductive paths, and
   an area of said substrate suitable for operatively connecting a riser for making a plurality of connections to said conductive pads on said substrate, wherein the riser comprises a plurality of conductive paths for operative interconnections between said conductive pads on said substrate and said connectors on said exterior surface of said SiP package.

2. The SiP of claim 1 wherein said at least one additional device or component contains a plurality of components operatively interconnected for modifying the functionality of said plurality of components mounted on said substrate.

3. The SiP of claim 1 wherein said substrate is a SiP base substrate or an interposer substrate.

4. The SiP of claim 1 wherein said riser is a scaffold assembly or a portion of a substrate containing multiple layers and interconnecting vias.

5. A System in a Package (SiP), comprising:
   a base substrate comprising a plurality of layers with etched conductive paths and a plurality of vias associated therewith for making interconnections, and one or more conductive pads for additional interconnections,
   a plurality of components mounted on said base substrate and operatively interconnected using said vias and conductive paths,
   wherein an area of said base substrate is configured for operatively connecting a riser, wherein said riser comprises connective pads for making external connections to said base substrate, and conductive paths to make operative interconnections between said base substrate and a plurality of external connective pads located on an exterior surface of a package for said SiP,
   wherein an external substrate containing a plurality of components is operatively interconnected to said external connective pads on the exterior surface of the package and modifies the functionality of said components mounted on said base substrate.

6. The SiP of claim 5, wherein said external connective pads of said SiP comprise a ball grid array for interconnecting with said base substrate.

7. The SiP of claim 5, wherein said modification of the functionality of said components comprises a modification to the functionality of one or more of additional memory devices, wireless or wire-lined communications circuitry, security circuitry, Field Programmable Gate Arrays (FPGAs), Field Programmable Analog Arrays (FPAAs), sensors, video and analog interface devices.

8. The SiP of claim 5, wherein said conductive pads of said base substrate are arranged in a first pattern and said connective pads of said SiP package are arranged to operatively interface with said conductive pads in said pattern.

9. The SiP of claim 5, wherein said base substrate, said external substrate, a plurality of components formed on said base substrate, and a plurality of components formed on said external substrate are encapsulated together.

10. The SiP of claim 5, wherein
said base substrate and a plurality of components formed on said base substrate are encapsulated,
said external substrate and a plurality of components formed on said external substrate are encapsulated, and
the encapsulation of said base substrate and the plurality of components formed on said base substrate are different from the encapsulation of said external substrate and the plurality of components formed on said external substrate.

11. The SiP of claim 5 wherein said base substrate further comprises, a plurality of connectors disposed on a surface of said base substrate for making external connections.

12. The SiP of claim 5 wherein said conductive paths comprise bond wires.

13. A method for manufacturing a System in a Package (SiP) comprising:
providing a base substrate for said SiP,
assembling a plurality of components on said base substrate for providing a first set of functionality,
providing a second substrate for said SiP,
assembling a second plurality of components on said second substrate for providing a second set of functionality,
providing a third substrate for said SiP,
assembling a third plurality of components on said third substrate for providing a third set of functionality, and
externally interconnecting one of said second or third substrate with said base substrate using a riser to modify the first set of functionality.

14. The method of claim 13, further comprising:
encapsulating said base substrate and said interconnected second or third substrate to create said SiP.

15. The method of claim 13, further comprising:
adapting an area on said base substrate to form a mounting area for mounting either said second or third substrate.

16. The method of claim 15, further comprising:
arranging a plurality of contacts on a surface of said base substrate in a fixed pattern for said mounting area.

17. The method of claim 15, further comprising:
packaging said base substrate and components.

18. The method of claim 15, further comprising:
packaging each of said second or third substrate and each respective components.

\* \* \* \* \*